(12) United States Patent  (10) Patent No.: US 8,957,889 B2
Miyake  (45) Date of Patent: Feb. 17, 2015

(54) LIGHT-EMITTING DEVICE

(75) Inventor: Hiroyuki Miyake, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 205 days.

(21) Appl. No.: 13/612,035

(22) Filed: Sep. 12, 2012

(65) Prior Publication Data

US 2013/0063413 A1    Mar. 14, 2013

(30) Foreign Application Priority Data

Sep. 14, 2011 (JP) ................. 2011-200067

(51) Int. Cl.
G09G 5/00 (2006.01)
G09G 3/32 (2006.01)

(52) U.S. Cl.
CPC ............ G09G 3/3233 (2013.01); G09G 3/32 (2013.01); *G09G 2300/0819* (2013.01); *G09G 2300/0852* (2013.01); *G09G 2300/0861* (2013.01); *G09G 2310/0262* (2013.01); *G09G 2320/0233* (2013.01)
USPC ........................................................ 345/212

(58) Field of Classification Search
CPC ............ G09G 3/3233; G09G 3/3241; G09G 2320/02; G09G 3/3258; G09G 3/32; G09G 2300/819; G09G 2320/0233; G09G 2300/0861; G09G 2310/0262; G09G 2300/0852
See application file for complete search history.

(56) References Cited

U.S. PATENT DOCUMENTS

| 7,199,768 | B2 | 4/2007 | Ono et al. | |
|---|---|---|---|---|
| 7,674,650 | B2 | 3/2010 | Akimoto et al. | |
| 2008/0225061 | A1 | 9/2008 | Kimura et al. | |
| 2010/0032679 | A1 | 2/2010 | Kawae et al. | |
| 2010/0053041 | A1* | 3/2010 | Abe et al. | 345/76 |
| 2010/0096654 | A1 | 4/2010 | Godo | |
| 2011/0031496 | A1 | 2/2011 | Yamazaki et al. | |
| 2011/0031499 | A1 | 2/2011 | Kimura et al. | |
| 2011/0057187 | A1 | 3/2011 | Sakakuro et al. | |
| 2011/0062434 | A1 | 3/2011 | Eguchi et al. | |
| 2011/0108837 | A1 | 5/2011 | Yamazaki et al. | |
| 2011/0122324 | A1* | 5/2011 | Yamashita et al. | 348/739 |
| 2011/0133181 | A1 | 6/2011 | Yamazaki | |
| 2011/0175674 | A1* | 7/2011 | Shimizu et al. | 327/537 |
| 2011/0210324 | A1 | 9/2011 | Sakakura et al. | |
| 2011/0210355 | A1 | 9/2011 | Yamazaki et al. | |
| 2012/0169798 | A1* | 7/2012 | Ebisuno | 345/690 |
| 2012/0249510 | A1* | 10/2012 | Jankovic et al. | 345/211 |
| 2013/0069068 | A1 | 3/2013 | Miyake | |

FOREIGN PATENT DOCUMENTS

JP    2004-280059 A    10/2004

* cited by examiner

*Primary Examiner* — Lixi C Simpson
(74) *Attorney, Agent, or Firm* — Fish & Richardson P.C.

(57) ABSTRACT

In a light-emitting device, supply of current is controlled using a transistor having a normal gate electrode (a first gate electrode) and a second gate electrode for controlling threshold voltage. The light-emitting device comprises one or more switches for selecting conduction or non-conduction between the first gate electrode and a drain terminal of the transistor. When the threshold voltage of the transistor is acquired, the first gate electrode and the drain terminal of the transistor are brought into conduction with the switch, and the threshold voltage of the transistor is shifted by controlling the potential of the second gate electrode.

22 Claims, 16 Drawing Sheets

Vgs=Von

Vgs=0

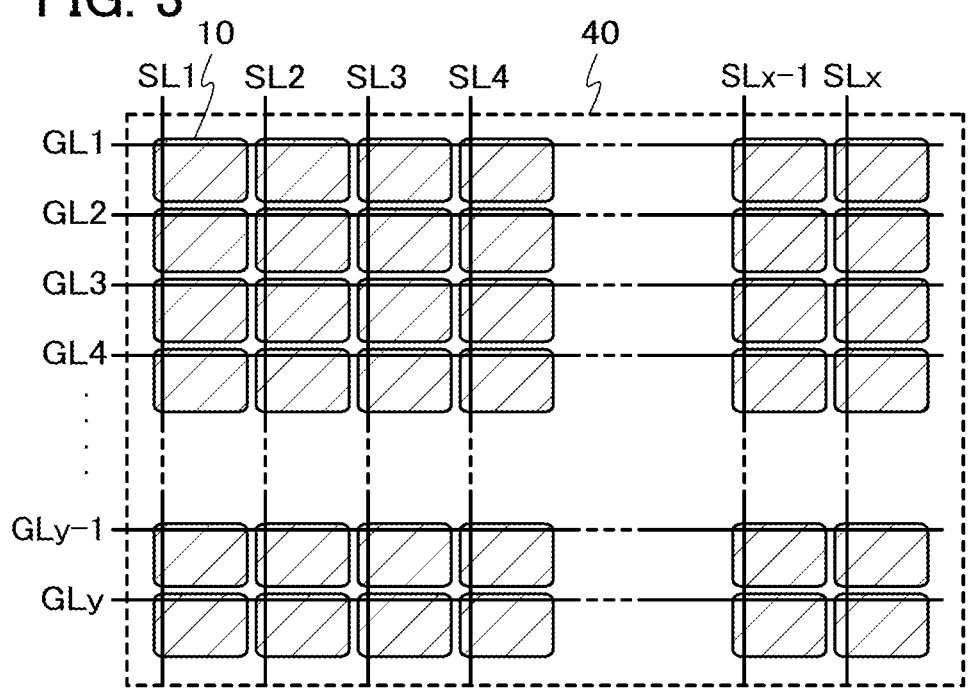

Period t1

Period t2 at the termination of the period t3 at the termination of the period t4

LIGHT-EMITTING DEVICE

BACKGROUND OF THE INVENTION

1. Field of the Invention

The present invention relates to a light-emitting device in which a transistor is provided in each pixel.

2. Description of the Related Art

In an active matrix light-emitting device including light-emitting elements, in general, at least a light-emitting element, a transistor (a switching transistor) that controls input of image signals to pixels, and a transistor (a driving transistor) that controls the value of current supplied to the light-emitting element in response to an image signal are provided in each pixel. In a light-emitting device having the above structure, drain current of a driving transistor is supplied to a light-emitting element; thus, when the threshold voltage of driving transistors varies among pixels, the luminance of light-emitting elements varies correspondingly.

Patent Document 1 discloses a display device in which the threshold voltage of a TFT 6 (a driver element) is corrected so that variations in threshold voltage do not influence the luminance of a light-emitting element.

REFERENCE

Patent Document 1: Japanese Published Patent Application No. 2004-280059

In the display device disclosed in Patent Document 1, a gate electrode and a drain electrode of the TFT 6 (the driver element) are short-circuited when threshold voltage is detected; thus, the TFT 6 operates in a saturation region. Thus, when current flowing from the drain electrode of the TFT 6 to a source electrode of the TFT 6 converges to 0 A, a potential difference between the gate electrode and the source electrode equals the threshold voltage, so that the threshold voltage can be acquired.

In the display device disclosed in Patent Document 1, the gate electrode and the drain electrode are short-circuited when the threshold voltage is detected; thus, the potential of the source electrode of the TFT 6 does not exceed the potential of the gate electrode of the TFT 6. In other words, the potential difference between the gate electrode and the source electrode is not negative voltage. Thus, in the case where the TFT 6 is normally off and the threshold voltage of the TFT 6 is 0 V or higher, the potential difference between the gate electrode and the source electrode can equal the threshold voltage. In the case where the TFT 6 is normally on and the threshold voltage of the TFT 6 is negative voltage, the potential difference between the gate electrode and the source electrode cannot equal the threshold voltage. Consequently, when the TFT 6 is normally on, the threshold voltage cannot be acquired, and generation of unevenness in luminance of a light-emitting element due to variations in threshold voltage cannot be prevented.

SUMMARY OF THE INVENTION

Under the technical background, it is an object of the present invention to provide a light-emitting device in which variations in luminance among pixels due to variations in threshold voltage can be reduced even when a transistor is normally on.

In a light-emitting device according to one embodiment of the present invention, supply of current to a light-emitting element is controlled using a transistor having a normal gate electrode (a first gate electrode) and a second gate electrode for controlling threshold voltage. The light-emitting device includes a switch for selecting conduction or non-conduction between the first gate electrode and a drain terminal of the transistor. When the threshold voltage of the transistor is acquired, the gate electrode and the drain terminal of the transistor are brought into conduction with the switch, and the threshold voltage of the transistor is shifted by controlling the potential of the second gate electrode.

The transistor for controlling supply of current to the light-emitting element may be any insulated-gate field-effect transistor. Specifically, the transistor includes at least a first gate electrode, a second gate electrode, a semiconductor film positioned between the first gate electrode and the second gate electrode, a first insulating film positioned between the first gate electrode and the semiconductor film, and a second insulating film positioned between the second gate electrode and the semiconductor film. The transistor may further include a source terminal and a drain terminal that are in contact with the semiconductor film.

With the above structure, even when the transistor for controlling supply of current to the light-emitting element is normally on, the transistor can be normally off when the threshold voltage is acquired. Thus, while the first gate electrode and the drain terminal of the transistor are brought into conduction with the switch, that is, are connected to each other, a potential difference between the second gate electrode and the source terminal can equal the threshold voltage.

In the light-emitting device according to one embodiment of the present invention, even when the transistor for controlling supply of current to the light-emitting element is normally on, the threshold voltage can be acquired. Thus, the threshold voltage can be corrected, so that variations in luminance among pixels can be reduced.

BRIEF DESCRIPTION OF THE DRAWINGS

In the accompanying drawings:

FIG. 3 illustrates the structure of a pixel portion;

DETAILED DESCRIPTION OF THE INVENTION

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that in this specification, the category of light-emitting devices includes panels in which a light-emitting element is formed in each pixel, and modules in which ICs and the like including controllers are mounted on the panels.

(Embodiment 1)

Figure 1:
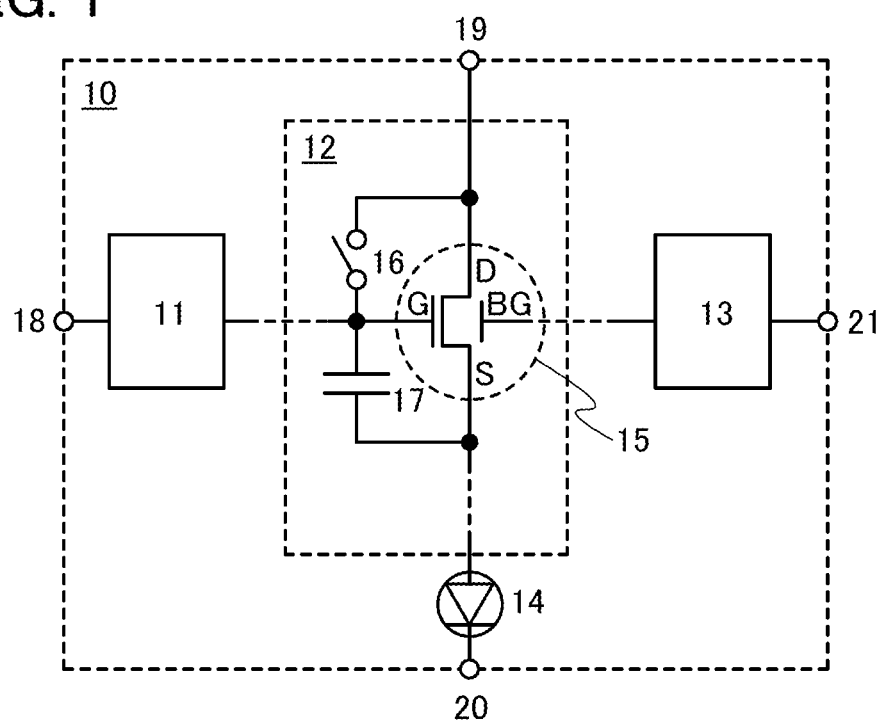
FIG. 1 illustrates the structure of a pixel included in a light-emitting device.

FIG. 1 illustrates the structure of a pixel included in a light-emitting device according to one embodiment of the present invention. A pixel 10 in FIG. 1 includes a switch 11, a circuit 12 for controlling the amount of current in response to an image signal, a switch 13, and a light-emitting element 14 supplied with the current from the circuit 12.

Specifically, the switch 11 controls whether an image signal supplied to a terminal 18 is supplied to the circuit 12. For example, the switch 11 can be one or more transistors. Alternatively, the switch 11 may be a capacitor instead of one or more transistors.

The circuit 12 includes a transistor 15 whose drain current is supplied to the light-emitting element 14, a switch 16, and a capacitor 17. The switch 16 selects conduction or non-conduction between a gate electrode (represented by G) and a drain terminal (represented by D) of the transistor 15, that is, controls connection between the gate electrode and the drain terminal of the transistor 15. The switch 16 can be one or more transistors. The capacitor 17 holds a potential difference between the gate electrode and a source terminal (represented by S) of the transistor 15, that is, gate voltage Vgs. Note that the capacitor 17 is not necessarily provided in the circuit 12 when gate capacitance formed between the gate electrode and an active layer of the transistor 15 is sufficiently high, for example.

In one embodiment of the present invention, the transistor 15 includes a back gate electrode (a second gate electrode) for controlling threshold voltage in addition to a normal gate electrode (a first gate electrode). The potential of the gate electrode of the transistor 15 is controlled in response to an image signal supplied to the circuit 12 through the switch 11. Further, the switch 13 controls supply of the potential of a terminal 21 to the back gate electrode (represented by BG). For example, the switch 13 can be one or more transistors. Alternatively, the switch 13 may be a capacitor instead of one or more transistors.

Note that the terms "source terminal" and "drain terminal" of a transistor interchange with each other depending on the type of the channel of the transistor or levels of potentials applied to electrodes. In general, in an n-channel transistor, an electrode to which a low potential is applied is called a source terminal, and an electrode to which a high potential is applied is called a drain terminal. Further, in a p-channel transistor, an electrode to which a low potential is applied is called a drain terminal, and an electrode to which a high potential is applied is called a source terminal. In this specification, although the connection relation of the transistor is described assuming that the source terminal and the drain terminal are fixed in some cases for convenience, actually, the names of the source terminal and the drain terminal interchange with each other depending on the relation of the potentials.

A "source terminal" of a transistor means a source region that is part of an active layer or a source electrode that is connected to an active layer. Similarly, a "drain terminal" of a transistor means a drain region that is part of an active layer or a drain electrode that is connected to an active layer.

In this specification, the term "connection" means electrical connection and corresponds to a state where current, voltage, or a potential can be supplied or transmitted. Accordingly, a connection state does not always mean a direct connection state but includes an indirect connection state through an element such as a wiring, a conductive film, a resistor, a diode, or a transistor so that current, voltage, or a potential can be supplied or transmitted.

Even when independent components are connected to each other in a circuit diagram, there is the case where one conductive film has functions of a plurality of components, such as the case where part of a wiring functions as an electrode. The term "connection" in this specification also means such a case where one conductive film has functions of a plurality of components.

In FIG. 1, the transistor 15 is an n-channel transistor. In that case, the source terminal of the transistor 15 is connected to an anode of the light-emitting element 14. The drain terminal of the transistor 15 is connected to a terminal 19, and a cathode of the light-emitting element 14 is connected to a terminal 20. The potential of the terminal 19 is higher than the sum of the potential of the terminal 20, threshold voltage Vthe of the light-emitting element 14, and threshold voltage Vth of the transistor 15. Thus, when the value of the drain current of the transistor 15 is determined in response to an image signal supplied to the circuit 12 through the switch 11, the light-emitting element 14 emits light by supply of the drain current to the light-emitting element 14.

In the case where the transistor 15 is a p-channel transistor, the source terminal of the transistor 15 is connected to the cathode of the light-emitting element 14. The drain terminal of the transistor 15 is connected to the terminal 19, and the anode of the light-emitting element 14 is connected to the terminal 20. The potential of the terminal 20 is higher than the sum of the potential of the terminal 19, the threshold voltage Vthe of the light-emitting element 14, and the threshold voltage Vth of the transistor 15. As in the case where the transistor 15 is an n-channel transistor, in the case where the transistor 15 is a p-channel transistor, when the value of the drain current of the transistor 15 is determined in response to an image signal supplied to the circuit 12 through the switch 11, the light-emitting element 14 emits light by supply of the drain current to the light-emitting element 14.

In one embodiment of the present invention, before the value of the drain current of the transistor 15 is determined in response to an image signal, the threshold voltage of the transistor 15 is acquired while the gate electrode and the drain terminal of the transistor 15 are brought into conduction with the switch 16. By determining the value of the drain current of the transistor 15 in response to an image signal after the threshold voltage is acquired, variations in threshold voltage among pixels can be prevented from influencing the value of the drain current.

In one embodiment of the present invention, the transistor 15 includes the back gate electrode for controlling the threshold voltage in addition to the normal gate electrode, as described above. The threshold voltage Vth of the transistor 15 is controlled in response to a potential applied to the back gate electrode. In one embodiment of the present invention, in the case of the normally-on transistor 15, when the threshold voltage is acquired, by controlling the potential of the back gate electrode, the threshold voltage Vth of the transistor 15 is shifted so that the transistor 15 is normally off The shift amount of the threshold voltage Vth of the transistor 15 is controlled in response to the level of the potential of the back gate electrode, specifically, a potential difference between the source terminal and the back gate electrode.

Specifically, in the case where the transistor 15 is an n-channel transistor, the transistor 15 is normally on when the threshold voltage Vth of the transistor 15 is negative voltage. Thus, in the case where the transistor 15 is an n-channel transistor, the threshold voltage Vth is shifted in a positive direction by setting the potential of the back gate electrode lower than the potential of the source terminal, so that the transistor 15 is normally off. In the case where the transistor 15 is a p-channel transistor, the transistor 15 is normally on when the threshold voltage Vth of the transistor 15 is positive voltage. Thus, in the case where the transistor 15 is a p-channel transistor, the threshold voltage Vth is shifted in a negative direction by setting the potential of the back gate electrode higher than the potential of the source terminal, so that the transistor 15 is normally off.

Note that it is difficult to acquire the threshold voltage when the transistor 15 is normally on. The reason is described below using an example in which the transistor 15 is an n-channel transistor.

Figure 2A:
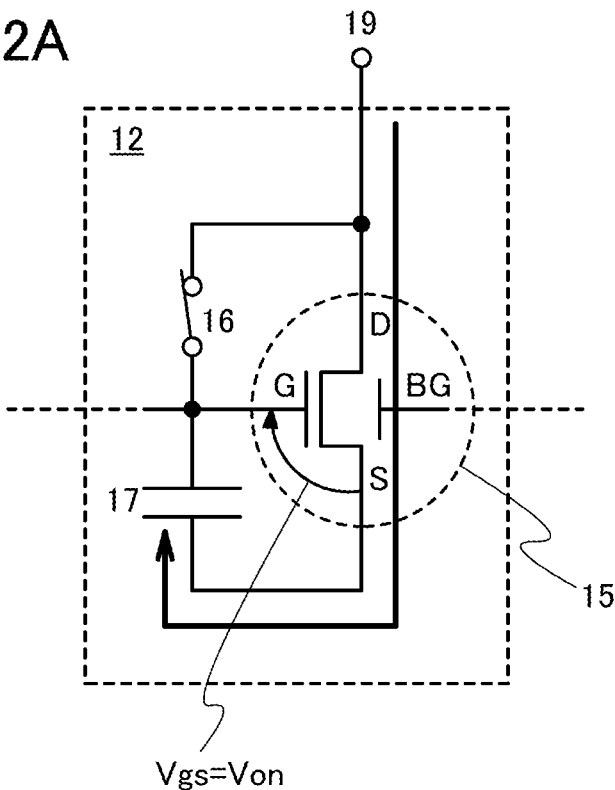
FIGS. 2A and 2B are enlarged views of a circuit 12.
Figure 2B:
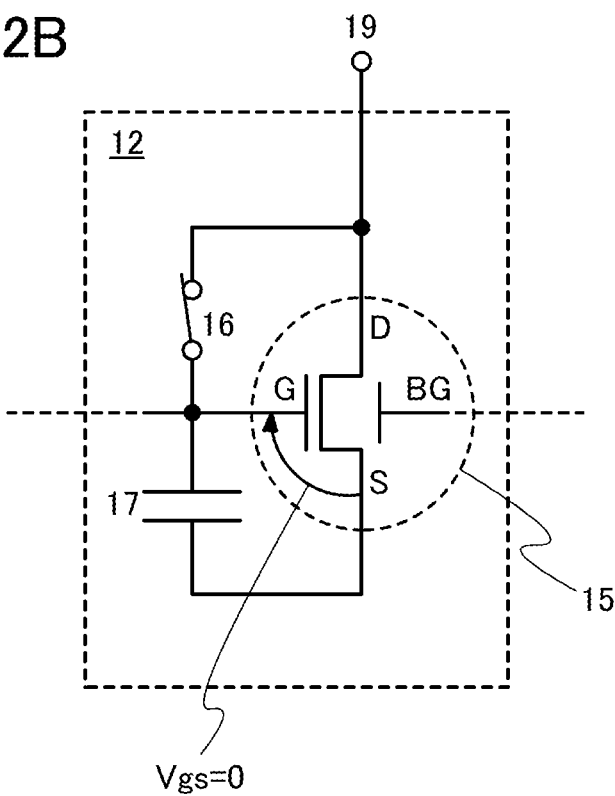

FIGS. 2A and 2B are enlarged views of the circuit 12. As illustrated in FIG. 2A, in the case where the transistor 15 is an n-channel transistor, before the threshold voltage is acquired, the terminal 19 is kept at a potential that is higher than the potential of the source terminal of the transistor 15. Specifically, a potential difference Von is produced between the source terminal of the transistor 15 and the terminal 19 so that the potential of the terminal 19 is higher than the sum of the potential of the source terminal of the transistor 15 and the threshold voltage Vth of the transistor 15. Then, when the switch 16 is turned on, the gate electrode and the drain terminal of the transistor 15 are connected to each other.

Thus, as illustrated in FIG. 2A, the gate voltage Vgs of the transistor 15 equals the potential difference Von, so that the transistor 15 is turned on and drain current flows. Under the above condition, the gate electrode of the transistor 15 is connected to one electrode of the capacitor 17 and the source terminal of the transistor 15 is connected to the other electrode of the capacitor 17, so that the drain current of the transistor 15 flows only to the capacitor 17.

With the above structure, electric charge accumulated in the capacitor 17 is released, so that the potential of the source terminal of the transistor 15 is raised. Then, the rise in potential of the source terminal leads to a gradual decrease in the gate voltage Vgs of the transistor 15, though the gate voltage Vgs of the transistor 15 equals the potential difference Von at the beginning of supply of the drain current.

In the case where the transistor 15 is normally off, as the gate voltage Vgs approaches the threshold voltage Vth, the drain current becomes 0 A. Accordingly, the threshold voltage Vth is held in the capacitor 17, and the acquisition of the threshold voltage Vth is terminated. In the case where the transistor 15 is normally on, the threshold voltage Vth is negative voltage. Thus, in order to acquire the threshold voltage Vth, the potential of the gate electrode should be lower than the potential of the source terminal, and the gate voltage Vgs should be negative voltage. However, since the terminal 19 is kept at the potential that is higher than the potential of the source terminal of the transistor 15 as described above, the potential of the gate electrode does not fall below the potential of the source terminal. Thus, in the case where the transistor 15 is normally on, as illustrated in FIG. 2B, as the gate voltage Vgs approaches 0 V and a potential difference between the source terminal and the drain terminal of the transistor 15 approaches 0 V, the drain current of the transistor 15 becomes 0 A. Accordingly, the threshold voltage Vth is not held in the capacitor 17.

In one embodiment of the present invention, even in the case where the transistor 15 is normally on, when the threshold voltage Vth is acquired, the transistor 15 is normally off by shifting the threshold voltage Vth. By acquiring the threshold voltage, variations in threshold voltage among pixels can be corrected, so that variations in luminance among the pixels can be reduced.

Further, as described above, in one embodiment of the present invention, any structure can be used as long as connection between the gate electrode and the drain terminal of the transistor 15 can be controlled with the switch 16. Any structure can be used as long as the gate voltage Vgs of the transistor 15 can be held in the capacitor 17 or the gate capacitance of the transistor 15 in the case where the capacitor 17 is not provided. Alternatively, any structure can be used as long as electric charge accumulated in the capacitor 17 is released by drain current flowing to the transistor 15 and thus the threshold voltage of the transistor 15 is held in the capacitor 17. Thus, the circuit 12 may include a circuit component such as a transistor, a capacitor, a resistor, or an inductor in addition to the transistor 15, the switch 16, and the capacitor 17. Furthermore, in order to achieve the structure, a different circuit component may be provided among the transistor 15, the switch 16, the capacitor 17, and the terminal 19.

FIG. 3 illustrates a structure example of a pixel portion in a light-emitting device according to one embodiment of the present invention. In FIG. 3, a pixel portion 40 includes a plurality of pixels 10 arranged in a matrix. The pixel portion 40 includes at least scan lines GL for selecting the plurality of pixels 10 row by row and signal lines SL for transmitting image signals to the selected pixels 10. Each of the plurality of pixels 10 is connected to at least one of the scan lines GL and at least one of the signal lines SL.

Note that the kinds and number of the lines can be determined by the structure, number, and position of the pixels 10. Specifically, in the case of the pixel portion 40 in FIG. 3, the pixels 10 are arranged in a matrix of x columns×y rows, and signal lines SL1 to SLx and scan lines GL1 to GLy are provided in the pixel portion 40.

In one embodiment of the present invention, even when the pixel portion 40 includes the pixel 10 having the normally-on transistor 15 and the pixel 10 having the normally-off transistor 15, the transistors 15 are normally off in all the pixels 10, so that the threshold voltage can be acquired.

Specifically, in the pixel portion 40 in FIG. 3, one potential for correcting the threshold voltage may be applied to the back gate electrodes of the transistors 15 in all the pixels 10. Alternatively, one potential for correcting the threshold voltage may be applied to the back gate electrodes of the transistors 15 in pixels of the same row, that is, a plurality of pixels connected to the same scan line GL. Alternatively, one potential for correcting the threshold voltage may be applied to the back gate electrodes of the transistors 15 in pixels of the same column, that is, a plurality of pixels connected to the same signal line SL. Accordingly, even when the transistors 15 are normally on in all the pixels 10 in the pixel portion 40 or the pixel portion 40 includes the pixel 10 having the normally-on transistor 15 and the pixel 10 having the normally-off transistor 15, the threshold voltage can be acquired.

(Embodiment 2)

Figure 4:
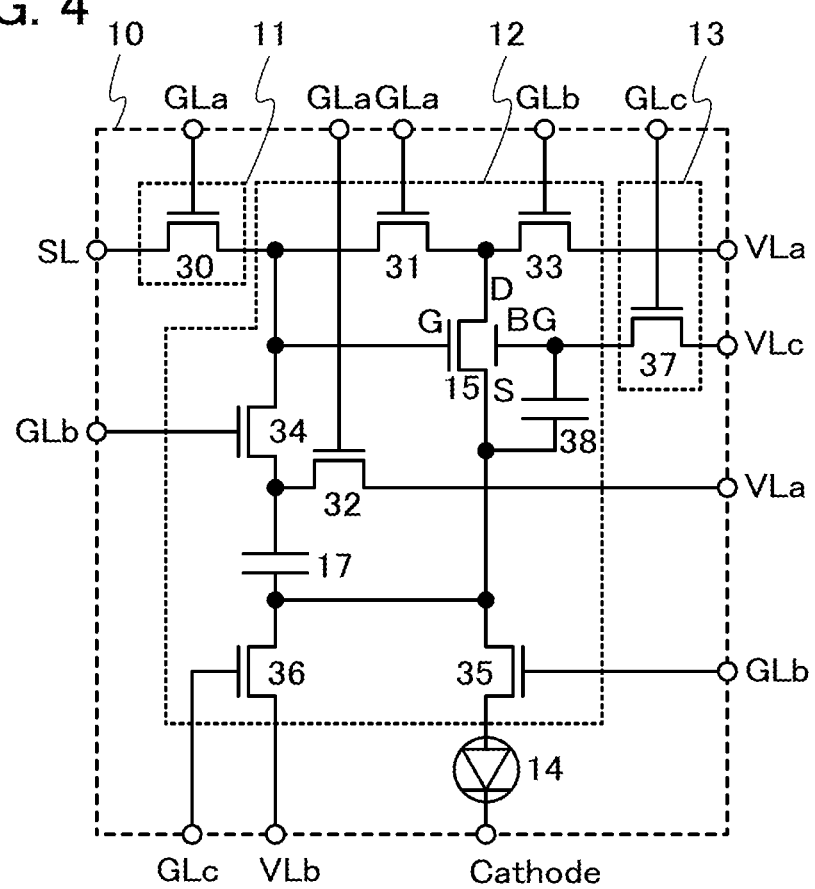
FIG. 4 illustrates the structure of a pixel included in a light-emitting device.

FIG. 4 illustrates a specific structure example of a pixel in a light-emitting device according to one embodiment of the present invention.

As in FIG. 1, the pixel 10 in FIG. 4 includes the switch 11, the circuit 12, the switch 13, and the light-emitting element 14. In the pixel 10 in FIG. 4, the switch 11 is a transistor 30. Further, the circuit 12 includes the transistor 15, the capacitor 17, transistors 31 to 36, and a capacitor 38. The transistor 31 corresponds to the switch 16 in FIG. 1. The switch 13 is a transistor 37.

Note that in FIG. 4, the transistor 15 is an n-channel transistor.

Specifically, in the pixel 10 in FIG. 4, a gate electrode of the transistor 30 is connected to a scan line GLa. One of a source terminal and a drain terminal of the transistor 30 is connected to the signal line SL. The other of the source terminal and the drain terminal of the transistor 30 is connected to the gate electrode of the transistor 15. A gate electrode of the transistor 31 is connected to the scan line GLa. One of a source terminal and a drain terminal of the transistor 31 is connected to the gate electrode of the transistor 15. The other of the source terminal and the drain terminal of the transistor 31 is connected to the drain terminal of the transistor 15. A gate electrode of the transistor 32 is connected to the scan line GLa. One of a source terminal and a drain terminal of the transistor 32 is connected to one electrode of the capacitor 17. The other of the source terminal and the drain terminal of the transistor 32 is connected to a line VLa. A gate electrode of the transistor 33 is connected to a scan line GLb. One of a source terminal and a drain terminal of the transistor 33 is connected to the drain terminal of the transistor 15. The other of the source terminal and the drain terminal of the transistor 33 is connected to the line VLa. A gate electrode of the transistor 34 is connected to the scan line GLb. One of a source terminal and a drain terminal of the transistor 34 is connected to the gate electrode of the transistor 15. The other of the source terminal and the drain terminal of the transistor 34 is connected to one electrode of the capacitor 17. A gate electrode of the transistor 35 is connected to the scan line GLb. One of a source terminal and a drain terminal of the transistor 35 is connected to the source terminal of the transistor 15 and the other electrode of the capacitor 17. The other of the source terminal and the drain terminal of the transistor 35 is connected to the anode of the light-emitting element 14. A gate electrode of the transistor 36 is connected to a scan line GLc. One of a source terminal and a drain terminal of the transistor 36 is connected to the other electrode of the capacitor 17 and the source terminal of the transistor 15. The other of the source terminal and the drain terminal of the transistor 36 is connected to a line VLb. One electrode of the capacitor 38 is connected to the back gate electrode of the transistor 15. The other electrode of the capacitor 38 is connected to the source terminal of the transistor 15. A gate electrode of the transistor 37 is connected to the scan line GLc. One of a source terminal and a drain terminal of the transistor 37 is connected to the back gate electrode of the transistor 15. The other of the source terminal and the drain terminal of the transistor 37 is connected to a line VLc.

Figure 9:
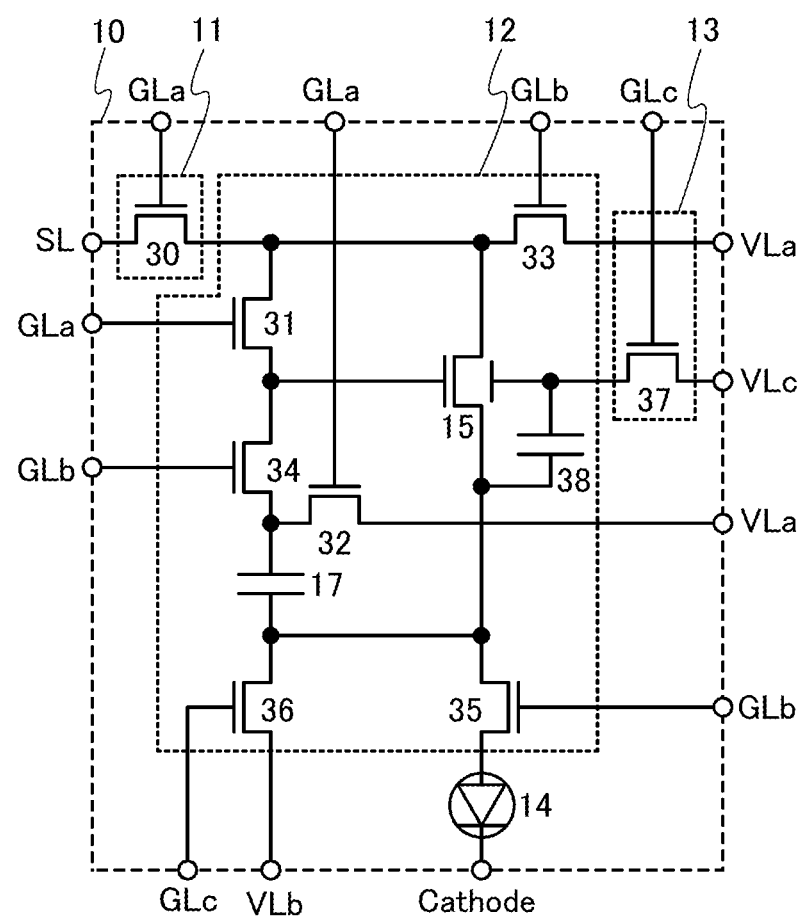
FIG. 9 illustrates the structure of the pixel included in the light-emitting device.

Note that in the pixel 10 in FIG. 4, one of the source terminal and the drain terminal of the transistor 31 is connected to the other of the source terminal and the drain terminal of the transistor 30, and the other of the source terminal and the drain terminal of the transistor 31 is connected to one of the source terminal and the drain terminal of the transistor 33. The connection of the transistor 31 may be any connection as long as the transistor 31 can control the connection between the gate electrode and the drain terminal of the transistor 15. Thus, for example, as in the pixel 10 in FIG. 9, one of the source terminal and the drain terminal of the transistor 31 may be connected to the other of the source terminal and the drain terminal of the transistor 30 and one of the source terminal and the drain terminal of the transistor 33, and the other of the source terminal and the drain terminal of the transistor 31 may be connected to one of the source terminal and the drain terminal of the transistor 34.

Next, the operation of the pixel 10 in FIG. 4 is described.

Figure 5:
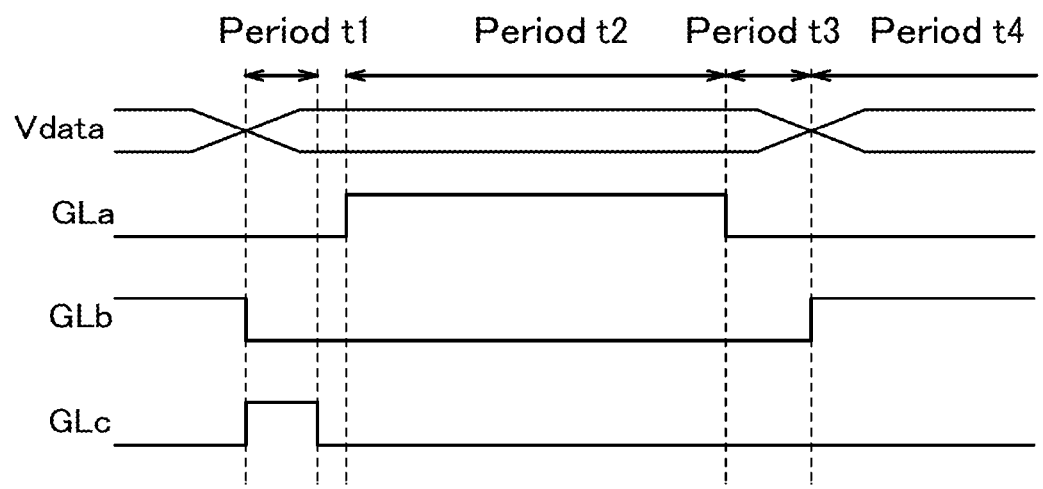
FIG. 5 is a timing chart illustrating the operation of the pixel.

FIG. 5 is an example of a timing chart of a potential Vdata applied to the signal line SL and potentials applied to the scan line GLa, the scan line GLb, and the scan line GLc, respectively. Note that in the timing chart in FIG. 5, the transistor 15 and the transistors 30 to 37 are all n-channel transistors.

The operation of the pixel 10 can be described with four separate periods t1 to t4, as illustrated in FIG. 5. FIGS. 6A and 6B and FIGS. 7A and 7B schematically illustrate the operation of the pixel 10 in each period. Note that in FIGS. 6A and 6B and FIGS. 7A and 7B, the transistors 30 to 37 serving as switching elements are illustrated as switches.

Through the periods t1 to t4, a potential Vano is applied to the line VLa, a potential V0 is applied to the line VLb, a potential V1 is applied to the line VLc, and a potential Vcat is applied to the cathode of the light-emitting element 14. A difference between the potential Vano and the potential Vcat in the case of the potential Vcat used as a reference is higher than the threshold voltage Vthe of the light-emitting element 14. Note that the threshold voltage Vthe of the light-emitting element 14 is assumed to be 0 V in the following description.

First, as illustrated in FIG. 5, in the period t1, low potentials are applied to the scan lines GLa and GLb, and a high potential is applied to the scan line GLc. Thus, the transistors 36 and 37 are turned on, and the transistors 30 to 35 are turned off.

Figure 6A:
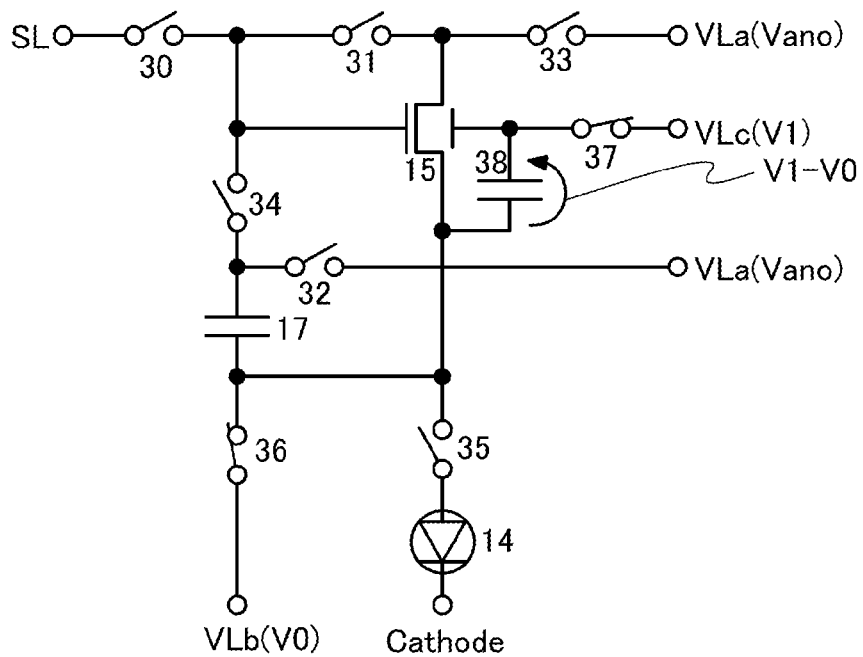
FIGS. 6A and 6B schematically illustrate the operation of the pixel.

FIG. 6A schematically illustrates the operation of the pixel 10 in the period t1. In the period t1, the transistors 36 and 37 are turned on and the transistors 30 to 35 are turned off as described above, so that the potential V1 is applied to the back gate electrode of the transistor 15, and the potential V0 is applied to the source terminal of the transistor 15. Thus, a potential difference between the back gate electrode and the source terminal becomes V1−V0 and is held in the capacitor 38.

Note that in this embodiment, V1−V0 is negative voltage. When the potential difference between the back gate electrode and the source terminal of the transistor 15 becomes V1-V0, the threshold voltage Vth of the transistor 15 is shifted in a positive direction. Thus, even when the transistor 15 is normally on when the potential difference between the back gate electrode and the source terminal is 0 V, the threshold voltage Vth is shifted in a positive direction to be 0 V or higher. Consequently, the transistor 15 can be normally off.

Next, as illustrated in FIG. 5, in the period t2, a high potential is applied to the scan line GLa, and low potentials are applied to the scan lines GLb and GLc. Thus, the transistors 30 to 32 are turned on, and the transistors 33 to 37 are turned off. The potential Vdata of an image signal is applied to the signal line SL.

Figure 6B:
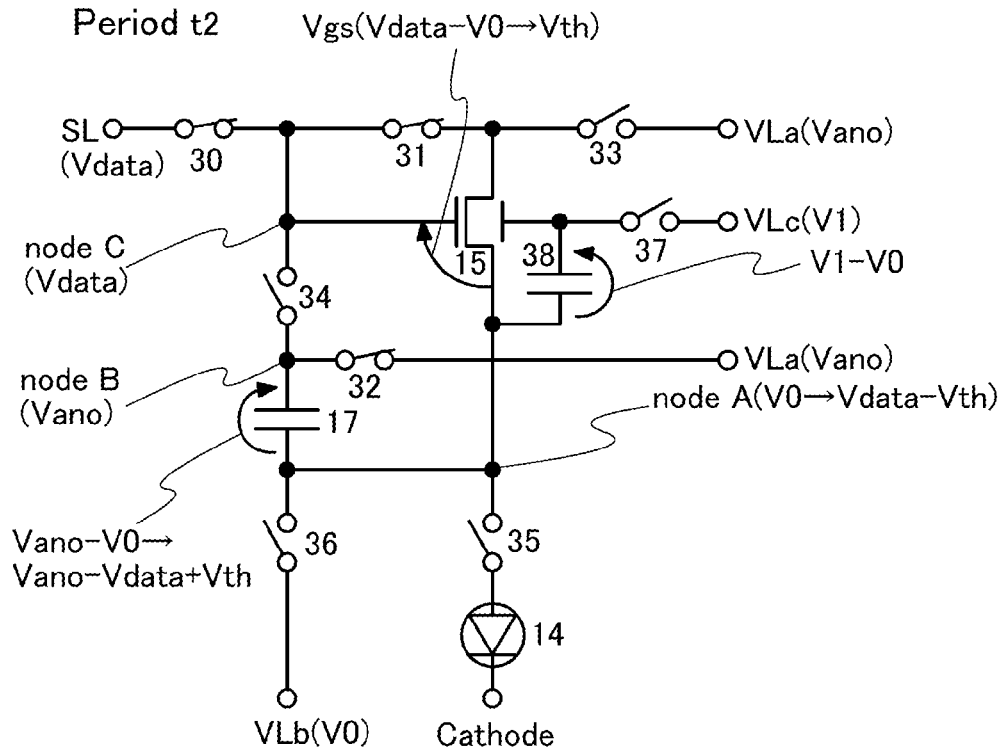

FIG. 6B schematically illustrates the operation of the pixel 10 in the period t2. At the beginning of the period t2, the transistors 30 to 32 are turned on and the transistors 33 to 37 are turned off as described above and the potential Vdata of the image signal is applied to the signal line SL, so that the potential of the source terminal of the transistor 15 and the other electrode of the capacitor 17 (the potential of a node A) becomes the potential V0. Further, the potential of one electrode of the capacitor 17 (the potential of a node B) becomes the potential Vano. Thus, a potential difference applied to the capacitor 17 becomes Vano−V0.

In addition, the potential difference V1−V0 between the back gate electrode and the source terminal of the transistor 15 is held in the capacitor 38. Thus, the threshold voltage Vth of the transistor 15 remains at 0 V or higher, and the transistor 15 is kept normally off.

Further, the potential of the gate electrode of the transistor 15 (the potential of a node C) becomes the potential Vdata. Thus, the gate voltage Vgs of the transistor 15 becomes Vdata−V0. Naturally, the level of the potential Vdata of the image signal depends on image data contained in the image signal; however, the potential Vdata is higher than the sum of the potential V0 and the threshold voltage Vth of the transistor 15. Consequently, the transistor 15 is turned on, and electric charge accumulated in the capacitor 17 is released via the transistor 15.

After the electric charge is released from the capacitor 17, the potential of the source terminal of the transistor 15 is raised, and the gate voltage Vgs that is the potential difference Vdata−V0 at the beginning of the period t2 approaches the threshold voltage Vth over time. In addition, although the potential difference applied to the capacitor 17 at the beginning of the period t2 is Vano−V0, after the electric charge is released from the capacitor 17, the potential difference held in the capacitor 17 approaches Vano−Vdata+Vth over time. Consequently, the transistor 15 is eventually turned off.

Thus, in one embodiment of the present invention, even when the transistor 15 is normally on, the transistor 15 is normally off by shifting the threshold voltage Vth of the transistor 15 in the period t1, so that the threshold voltage Vth of the transistor 15 can be acquired in the period t2.

Note that in one embodiment of the present invention, the period t2 is not necessarily terminated when the gate voltage Vgs of the transistor 15 equals the threshold voltage Vth. For example, when the gate voltage Vgs of the transistor 15 is lower than the potential difference Vdata−V0 and higher than the threshold voltage Vth, the period t2 may be terminated.

Next, as illustrated in FIG. 5, in the period t3, low potentials are applied to the scan lines GLa, GLb, and GLc. Thus, the transistors 30 to 37 are turned off.

Figure 7A:
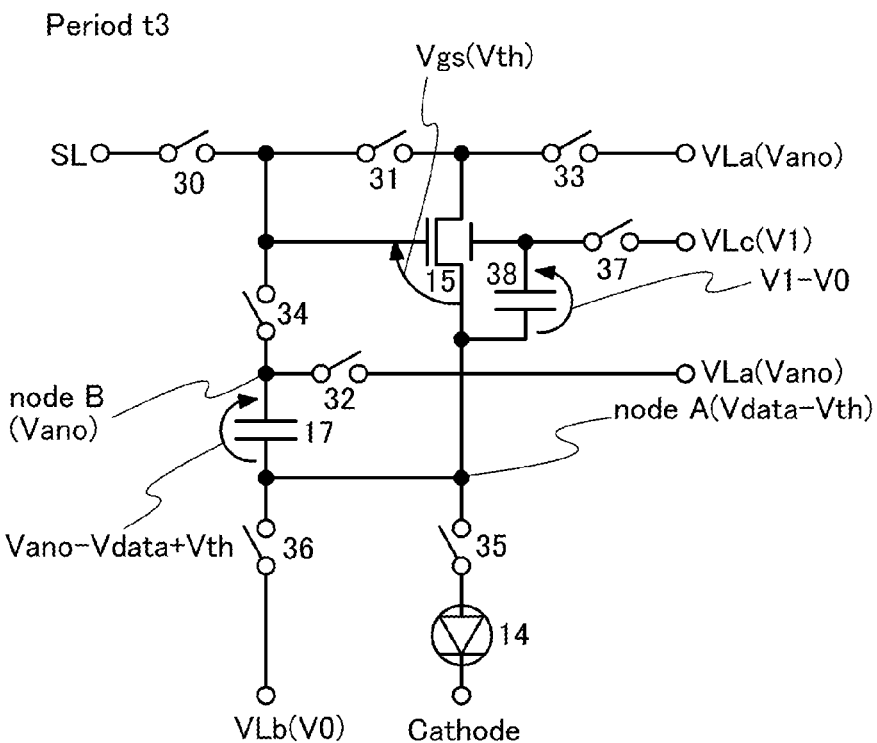
FIGS. 7A and 7B schematically illustrate the operation of the pixel.

FIG. 7A schematically illustrates the operation of the pixel 10 in the period t3. The transistors 30 to 37 are turned off as described above, so that a potential difference Vano−Vdata+Vth is held in the capacitor 17. In addition, the potential difference V1−V0 between the back gate electrode and the source terminal of the transistor 15 is held in the capacitor 38.

Next, as illustrated in FIG. 5, in the period t4, a high potential is applied to the scan line GLb, and low potentials are applied to the scan lines GLa and GLc. Thus, the transistors 33 to 35 are turned on, and the transistors 30, 31, 32, 36, and 37 are turned off.

Figure 7B:
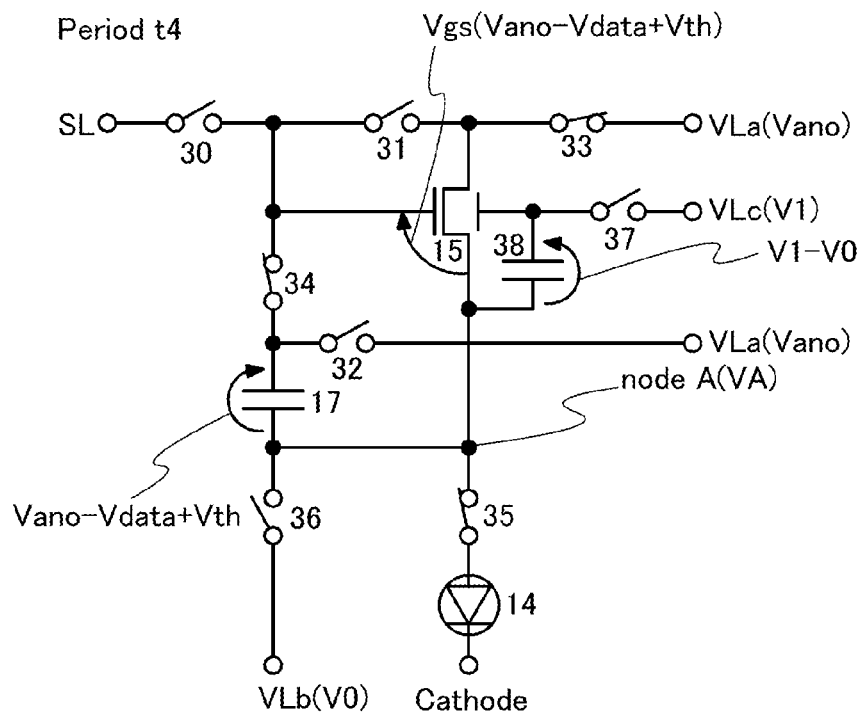

FIG. 7B schematically illustrates the operation of the pixel 10 in the period t4. The transistors 33 to 35 are turned on and the transistors 30, 31, 32, 36, and 37 are turned off in the period t4 as described above, so that the potential difference V1−V0 between the back gate electrode and the source terminal of the transistor 15 is held in the capacitor 38. Thus, the threshold voltage Vth of the transistor 15 remains at 0 V or higher, and the transistor 15 is kept normally off.

Ideally, the potential difference Vano−Vdata+Vth held in the capacitor 17 is applied between the gate electrode and the source terminal of the transistor 15 as the gate voltage Vgs of the transistor 15.

Note that the gate voltage Vgs of the transistor 15 actually depends on the ratio between the capacitance of the capacitor 17 and the capacitance of the light-emitting element 14; thus, the gate voltage Vgs of the transistor 15 is not necessarily ideal voltage, that is, the potential difference Vano−Vdata+Vth. A potential VA of the node A in the period t4 is described in detail below.

Figure 8A:
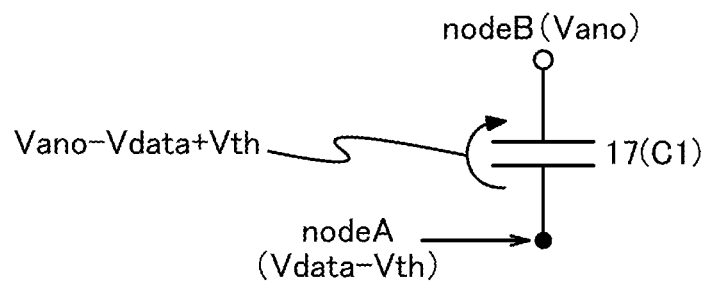
FIGS. 8A and 8B each schematically illustrate a state where a capacitor and a light-emitting element are connected in series to each other.

FIG. 8A is a circuit diagram of the capacitor 17. The capacitor 17 has capacitance C1. As illustrated in FIG. 8A, at the termination of the period t3, the potential of one electrode of the capacitor 17 (corresponding to the node B) is the potential Vano, and the potential of the other electrode of the capacitor 17 (corresponding to the node A) is a potential Vdata−Vth. Thus, the potential difference Vano−Vdata+Vth is held in the capacitor 17.

Figure 8B:
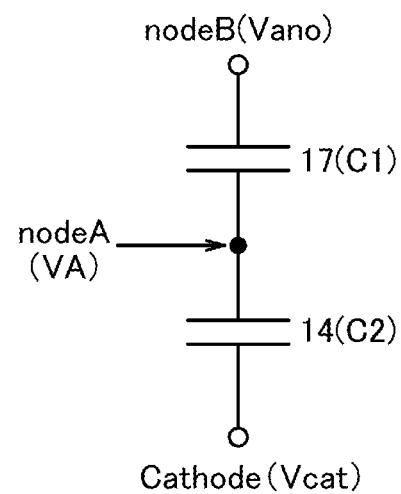

In the period t4, the capacitor 17 and the light-emitting element 14 are connected in series to each other through the transistor 35. FIG. 8B schematically illustrates a state where the capacitor 17 and the light-emitting element 14 are connected in series to each other. In FIG. 8B, the light-emitting element 14 is illustrated as one capacitor. The light-emitting element 14 has capacitance C2. As illustrated in FIG. 8B, at the termination of the period t4, the potential of the node B is the potential Vano, and the potential of the cathode of the light-emitting element 14 is the potential Vcat. The potential of the other electrode of the capacitor 17 and the anode of the light-emitting element 14 (corresponding to the node A) is the potential VA.

The potential VA of the node A depends on the ratio between the capacitance C1 of the capacitor 17 and the capacitance C2 of the light-emitting element 14. Specifically, in the case where the potential of the node A at the termination of the period t4 is the potential VA, the gate voltage Vgs of the transistor 15 in the period t4 is represented by Equation 1. Note that Equation 1 shows the case where the potential of the node A is the potential Vdata−Vth in the period t3.

$$Vgs = Vano - VA = C2(Vano - Vdata)/(C1+C2) + Vth \quad \text{(Equation 1)}$$

Note that ideal gate voltage Vgs at the termination of the period t4 equals Vano−Vdata+Vth. When the gate voltage Vgs has this value, even when the threshold voltage Vth of the transistors 15 varies, the variation does not influence the drain current of the transistors 15. In order that the gate voltage Vgs approaches the ideal voltage, from Equation 1, it is clear that C2/(C1+C2) preferably approaches 1. In other words, when the capacitance C2 of the light-emitting element 14 is much higher than the capacitance C1 of the capacitor 17, the gate voltage Vgs can approach the ideal voltage.

If the gate voltage Vgs is close to Vano−Vdata+Vth in the period t4, the threshold voltage Vth is added to the gate voltage Vgs of the transistor 15. Consequently, variations in the threshold voltage Vth of the transistors 15 can be prevented from influencing the value of the drain current supplied to the light-emitting element 14. Alternatively, even when the transistor 15 is degraded and the threshold voltage Vth is changed, the change in the threshold voltage Vth can be prevented from influencing the value of the drain current supplied to the light-emitting element 14. Thus, it is possible to provide a light-emitting device capable of reducing luminance unevenness and displaying high-quality images.

The period t3 is not necessarily provided. The period t4 may be started right after the period t2. Note that when the period t3 is provided, a potential applied to the scan line GLb can be changed from a low level to a high level after a potential applied to the scan line GLa is changed from a high level to a low level. Consequently, the potential difference Vano−Vdata+Vth held in the capacitor 17 can be prevented from varying due to the change in potential applied to the scan line GLb.

The above operation is performed on the pixels 10 row by row. Image signals are written to all the pixels 10 in the pixel portion row by row, so that images are displayed.

In the light-emitting device according to one embodiment of the present invention, for example, in the case where amorphous silicon or an oxide semiconductor is used for a semiconductor film of the transistor 15, even when the transistor 15 is normally on, luminance unevenness can be reduced and high-quality images can be displayed.

Note that in the case where the gate voltage Vgs at the termination of the period t2 is not equal to the threshold voltage Vth but is lower than the potential difference Vdata–V0 and higher than the threshold voltage Vth as described above, not only the variations in the threshold voltage of the transistors 15 but also variations in mobility can be prevented from influencing the luminance of the light-emitting element 14. This is described in detail below.

Current Id that flows to the light-emitting element 14 is represented by $k\mu(Vgs-Vth)^2/2$, where $\mu$ is the mobility of the transistor 15 and k is a constant that depends on the channel length, channel width, and gate capacitance of the transistor 15. In the case where the mobility $\mu$ is not corrected, the drain current Id that flows to the light-emitting element 14 increases as the mobility $\mu$ increases, whereas the drain current Id that flows to the light-emitting element 14 decreases as the mobility $\mu$ decreases.

For example, in the case where the potential of the node A at the termination of the period t2 is lower than Vdata–Vth, the gate voltage Vgs of the transistor 15 is voltage Va. The voltage Va is the sum of the threshold voltage Vth and offset voltage Vb. In that case, at the termination of the period t2, a potential difference Vano–Vdata+Vb+Vth is held in the capacitor 17.

Then, in the period t4, the potential difference held in the capacitor 17 is the gate voltage Vgs of the transistor 15. Thus, the drain current Id in the period t4 is represented by $k\mu(Vano-Vdata+Vb)^2/2$. Consequently, even in the case where the potential of the node A at the termination of the period t2 is lower than Vdata–Vth, a change in value of drain current due to variations in the threshold voltage Vth is canceled.

In the case where the transistor 15 is an n-channel transistor, the offset voltage Vb is positive voltage. Accordingly, as the mobility $\mu$ decreases, the absolute value of the drain current Id increases. In contrast, as the mobility $\mu$ increases, the absolute value of the drain current Id decreases. Thus, Vb serves as a correction term for correcting variations in the drain current Id due to the mobility $\mu$ in the period t4; a decrease in the drain current Id can be inhibited even when the mobility $\mu$ decreases, whereas an increase in the drain current Id can be inhibited even when the mobility $\mu$ increases.

This embodiment can be combined with any of the other embodiments as appropriate.

(Embodiment 3)

Figure 10:
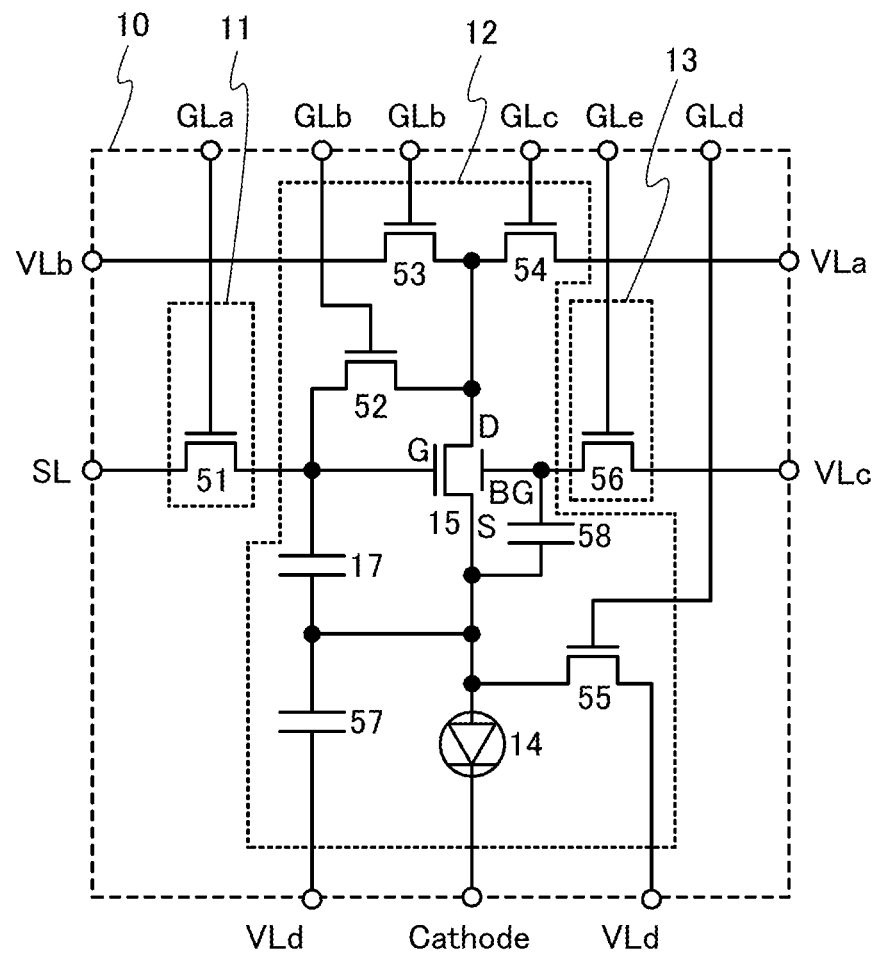
FIG. 10 illustrates the structure of a pixel included in a light-emitting device.

FIG. 10 illustrates a specific structure example of a pixel in a light-emitting device according to one embodiment of the present invention.

As in FIG. 1, the pixel 10 in FIG. 10 includes the switch 11, the circuit 12, the switch 13, and the light-emitting element 14. In the pixel 10 in FIG. 10, the switch 11 is a transistor 51. Further, the circuit 12 includes the transistor 15, the capacitor 17, transistors 52 to 55, and capacitors 57 and 58. The transistor 52 corresponds to the switch 16 in FIG. 1. The switch 13 is a transistor 56.

Note that in FIG. 10, the transistor 15 is an n-channel transistor.

Specifically, in the pixel 10 in FIG. 10, a gate electrode of the transistor 51 is connected to the scan line GLa. One of a source terminal and a drain terminal of the transistor 51 is connected to the signal line SL. The other of the source terminal and the drain terminal of the transistor 51 is connected to the gate electrode of the transistor 15 and one electrode of the capacitor 17. A gate electrode of the transistor 52 is connected to the scan line GLb. One of a source terminal and a drain terminal of the transistor 52 is connected to the gate electrode of the transistor 15 and one electrode of the capacitor 17. The other of the source terminal and the drain terminal of the transistor 52 is connected to the drain terminal of the transistor 15. A gate electrode of the transistor 53 is connected to the scan line GLb. One of a source terminal and a drain terminal of the transistor 53 is connected to the line VLb. The other of the source terminal and the drain terminal of the transistor 53 is connected to the drain terminal of the transistor 15. A gate electrode of the transistor 54 is connected to the scan line GLc. One of a source terminal and a drain terminal of the transistor 54 is connected to the drain terminal of the transistor 15. The other of the source terminal and the drain terminal of the transistor 54 is connected to the line VLa. A gate electrode of the transistor 55 is connected to a scan line GLd. One of a source terminal and a drain terminal of the transistor 55 is connected to the anode of the light-emitting element 14. The other of the source terminal and the drain terminal of the transistor 55 is connected to a line VLd. A gate electrode of the transistor 56 is connected to a scan line GLe. One of a source terminal and a drain terminal of the transistor 56 is connected to the back gate electrode of the transistor 15. The other of the source terminal and the drain terminal of the transistor 56 is connected to the line VLc. One electrode of the capacitor 57 is connected to the source terminal of the transistor 15, the other electrode of the capacitor 17, and the anode of the light-emitting element 14. The other electrode of the capacitor 57 is connected to the line VLd. One electrode of the capacitor 58 is connected to the back gate electrode of the transistor 15. The other electrode of the capacitor 58 is connected to the source terminal of the transistor 15.

Next, the operation of the pixel 10 in FIG. 10 is described.

The operation of the pixel 10 in FIG. 10 can be described with five separate periods t1 to t5.

Through the periods t1 to t5, the potential Vano is applied to the line VLa, a potential V2 is applied to the line VLb, a potential V3 is applied to the line VLc, a potential V4 is applied to the line VLd, and the potential Vcat is applied to the cathode of the light-emitting element 14. The difference between the potential Vano and the potential Vcat in the case of the potential Vcat used as a reference is higher than the threshold voltage Vthe of the light-emitting element 14. Note that the threshold voltage Vthe of the light-emitting element 14 is assumed to be 0 V in the following description. The potential V2 is higher than the potential Vcat and lower than the potential Vano. The potential V3 is lower than the potential Vcat and the potential V4. The potential V4 is lower than the potential Vcat.

First, in the period t1, the transistors 55 and 56 are turned on, and the transistors 51 to 54 are turned off. Thus, in the period t1, the potential V3 is applied to the back gate electrode of the transistor 15, and the potential V4 is applied to the source terminal of the transistor 15. Consequently, the potential difference between the back gate electrode and the source terminal becomes V3–V4 and is held in the capacitor 58.

Since the potential difference V3–V4 between the back gate electrode and the source terminal of the transistor 15 is negative voltage, the threshold voltage Vth of the transistor 15 is shifted in a positive direction. Thus, even when the transistor 15 is normally on when the potential difference between the back gate electrode and the source terminal is 0 V, the threshold voltage Vth is shifted in a positive direction to be 0 V or higher. Consequently, the transistor 15 can be normally off.

Next, in the period t2, the transistors 52, 53, and 55 are turned on, and the transistors 51, 54, and 56 are turned off. The potential difference V3−V4 between the back gate electrode and the source terminal of the transistor 15 is held in the capacitor 58. Thus, the threshold voltage Vth of the transistor 15 remains at 0 V or higher, and the transistor 15 is kept normally off. Further, in the period t2, the gate voltage Vgs of the transistor 15 becomes a potential difference V2−V4. Consequently, the transistor 15 is turned on, and drain current flows to the transistor 15.

Next, in the period t3, the transistors 52 and 53 are turned on, and the transistors 51, 54, 55, and 56 are turned off. The potential difference V3−V4 between the back gate electrode and the source terminal of the transistor 15 is held in the capacitor 58. Thus, the threshold voltage Vth of the transistor 15 remains at 0 V or higher, and the transistor 15 is kept normally off. After electric charge accumulated in the capacitor 17 is released through the transistor 15, the potential of the source terminal of the transistor 15 is raised. In addition, the gate voltage Vgs that is the potential difference V2−V4 at the beginning of the period t3 approaches the threshold voltage Vth over time. Consequently, the transistor 15 is eventually turned off.

Thus, in one embodiment of the present invention, even when the transistor 15 is normally on, the transistor 15 is normally off by shifting the threshold voltage Vth of the transistor 15 in the period t1, so that the threshold voltage Vth of the transistor 15 can be acquired in the period t3.

Note that in one embodiment of the present invention, the period t3 is not necessarily terminated when the gate voltage Vgs of the transistor 15 equals the threshold voltage Vth. For example, when the gate voltage Vgs of the transistor 15 is lower than the potential difference V2−V4 and higher than the threshold voltage Vth, the period t3 may be terminated. Accordingly, as in the pixel 10 in FIG. 4, not only variations in the threshold voltage Vth but also variations in the mobility of the transistors 15 can be corrected.

Next, in the period t4, the transistor 51 is turned on, and the transistors 52 to 56 are turned off. The potential Vdata of an image signal is applied to the signal line SL. The potential difference V3−V4 between the back gate electrode and the source terminal of the transistor 15 is held in the capacitor 58. Thus, the threshold voltage Vth of the transistor 15 remains at 0 V or higher, and the transistor 15 is kept normally off. When the potential Vdata is applied to the gate electrode of the transistor 15, the gate voltage Vgs of the transistor 15 is ideally a potential difference Vdata−Vcat+Vth.

Note that the gate voltage Vgs of the transistor 15 actually depends on the ratio between the capacitance of the capacitor 17 and the capacitance of the capacitor 57 and the light-emitting element 14; thus, the gate voltage Vgs of the transistor 15 is not necessarily ideal voltage, that is, the potential difference Vdata−Vcat+Vth. However, as in the pixel 10 in FIG. 4, when the total capacitance of the capacitor 57 and the light-emitting element 14 is much higher than the capacitance of the capacitor 17, the gate voltage Vgs can approach the ideal voltage.

Next, in the period t5, the transistor 54 is turned on, and the transistors 51, 52, 53, 55, and 56 are turned off. The potential difference V3−V4 between the back gate electrode and the source terminal of the transistor 15 is held in the capacitor 58. Thus, the threshold voltage Vth of the transistor 15 remains at 0 V or higher, and the transistor 15 is kept normally off.

The transistor 15 supplies drain current based on the gate voltage Vgs of the transistor 15 to the light-emitting element 14. The luminance of the light-emitting element 14 depends on the value of the drain current. As the drain current increases, the luminance of the light-emitting element 14 increases. As the drain current decreases, the luminance of the light-emitting element 14 decreases.

If the gate voltage Vgs is close to Vdata−Vcat+Vth in the period t4, the threshold voltage Vth is added to the gate voltage Vgs of the transistor 15. Consequently, in the period t5, variations in the threshold voltage Vth of the transistors 15 can be prevented from influencing the value of the drain current supplied to the light-emitting element 14. Alternatively, even when the transistor 15 is degraded and the threshold voltage Vth is changed, the change in the threshold voltage Vth can be prevented from influencing the value of the drain current supplied to the light-emitting element 14. Thus, it is possible to provide a light-emitting device capable of reducing luminance unevenness and displaying high-quality images.

The above operation is performed on the pixels 10 row by row. Image signals are written to all the pixels 10 in the pixel portion row by row, so that images are displayed.

In the light-emitting device according to one embodiment of the present invention, for example, in the case where amorphous silicon or an oxide semiconductor is used for the semiconductor film of the transistor 15, even when the transistor 15 is normally on, luminance unevenness can be reduced and high-quality images can be displayed.

This embodiment can be combined with any of the other embodiments as appropriate.

(Embodiment 4)

Figure 11:
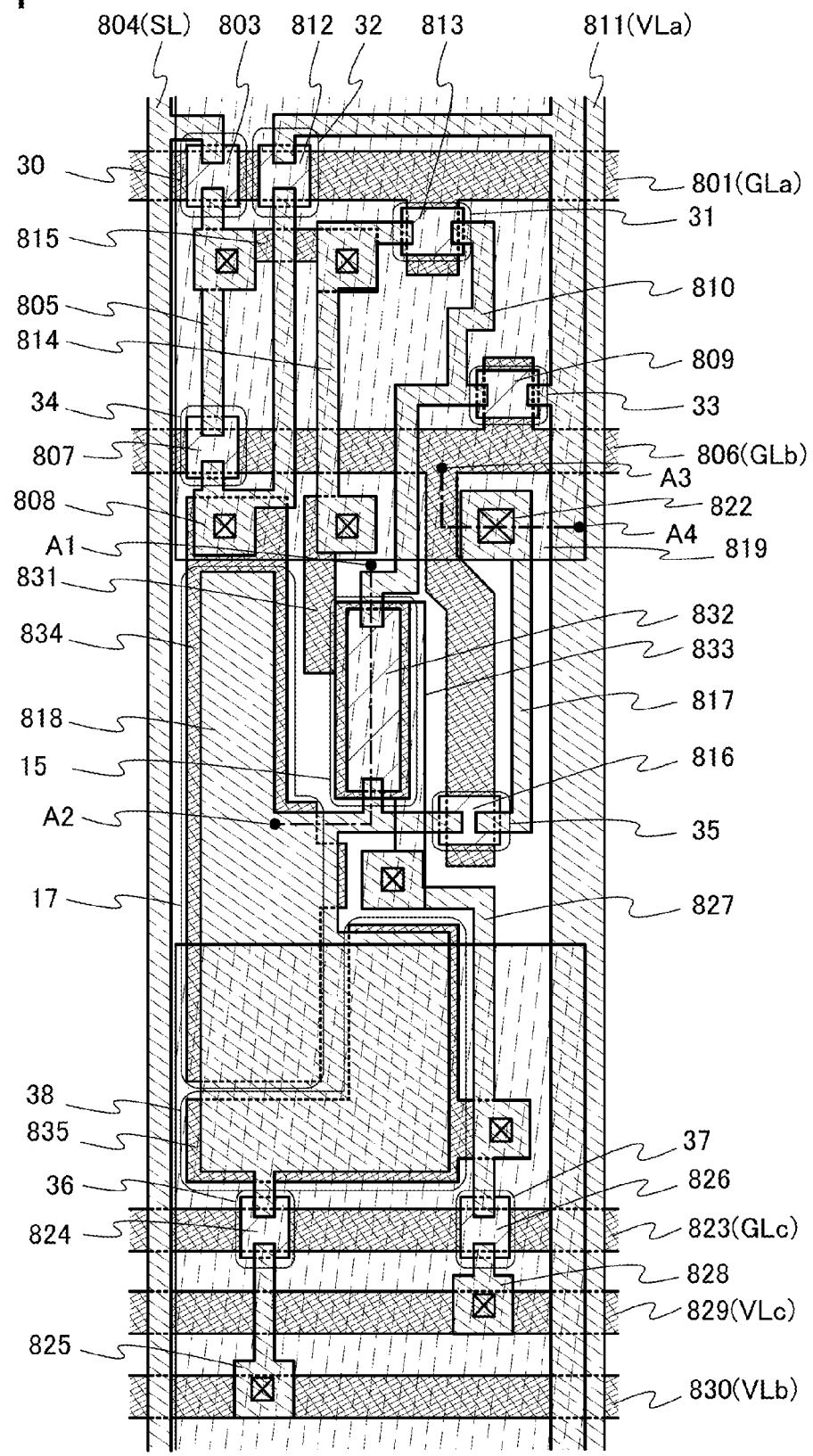
FIG. 11 is a top view of a pixel.
Figure 12:
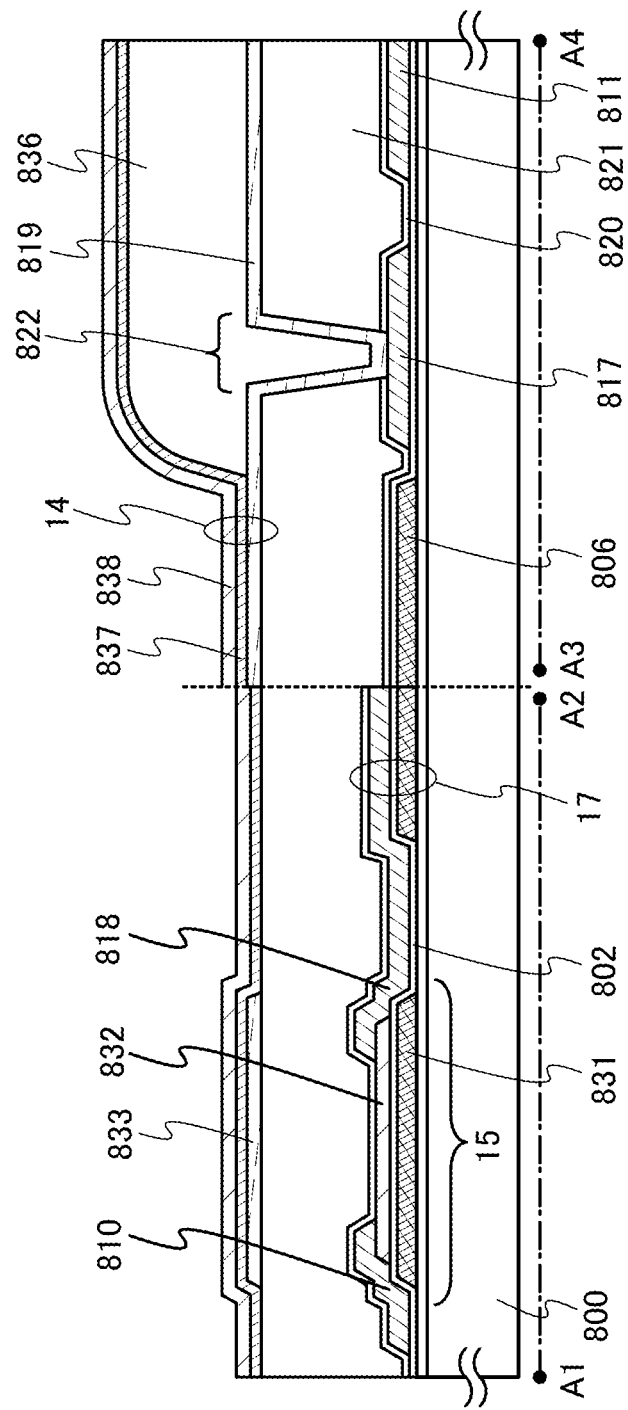
FIG. 12 is a cross-sectional view of the pixel.

The pixel layout of a light-emitting device according to one embodiment of the present invention is described with reference to FIG. 11 and FIG. 12 by using the pixel 10 in FIG. 4 as an example. FIG. 11 is an example of a top view of the pixel. FIG. 12 is an example of a cross-sectional view taken along dashed lines A1-A2 and A3-A4 in the top view in FIG. 11. Note that in order to clearly show the pixel layout, a variety of insulating films are not illustrated in the top view of the pixel in FIG. 11. In addition, in order to clearly show the layout of a variety of semiconductor elements included in the pixel, an EL layer and a cathode are not illustrated in the top view of the pixel in FIG. 11.

In the pixel in FIG. 11 and FIG. 12, the transistor 30 includes, over a substrate 800 having an insulating surface, a conductive film 801 functioning as a gate electrode, a gate insulating film 802 over the conductive film 801, a semiconductor film 803 positioned over the gate insulating film 802 to overlap with the conductive film 801, and conductive films 804 and 805 that are positioned over the semiconductor film 803 and function as a source terminal and a drain terminal. The conductive film 801 also functions as the scan line GLa. The conductive film 804 also functions as the signal line SL.

The transistor 34 includes, over the substrate 800 having an insulating surface, a conductive film 806 functioning as a gate electrode, the gate insulating film 802 over the conductive film 806, a semiconductor film 807 positioned over the gate insulating film 802 to overlap with the conductive film 806, and the conductive film 805 and a conductive film 808 that are positioned over the semiconductor film 807 and function as a source terminal and a drain terminal. The conductive film 806 also functions as the scan line GLb.

The transistor 33 includes, over the substrate 800 having an insulating surface, the conductive film 806 functioning as a gate electrode, the gate insulating film 802 over the conductive film 806, a semiconductor film 809 positioned over the gate insulating film 802 to overlap with the conductive film 806, and conductive films 810 and 811 that are positioned over the semiconductor film 809 and function as a source terminal and a drain terminal. The conductive film 811 also functions as the line VLa.

The transistor 32 includes, over the substrate 800 having an insulating surface, the conductive film 801 functioning as a gate electrode, the gate insulating film 802 over the conductive film 801, a semiconductor film 812 positioned over the gate insulating film 802 to overlap with the conductive film 801, and the conductive films 811 and 808 that are positioned over the semiconductor film 812 and function as a source terminal and a drain terminal.

The transistor 31 includes, over the substrate 800 having an insulating surface, the conductive film 801 functioning as a gate electrode, the gate insulating film 802 over the conductive film 801, a semiconductor film 813 positioned over the gate insulating film 802 to overlap with the conductive film 801, and the conductive film 810 and a conductive film 814 that are positioned over the semiconductor film 813 and function as a source terminal and a drain terminal. Note that the conductive film 814 is connected to the conductive film 805 through a conductive film 815.

The transistor 35 includes, over the substrate 800 having an insulating surface, the conductive film 806 functioning as a gate electrode, the gate insulating film 802 over the conductive film 806, a semiconductor film 816 positioned over the gate insulating film 802 to overlap with the conductive film 806, and conductive films 817 and 818 that are positioned over the semiconductor film 816 and function as a source terminal and a drain terminal.

The transistor 36 includes, over the substrate 800 having an insulating surface, a conductive film 823 functioning as a gate electrode, the gate insulating film 802 over the conductive film 823, a semiconductor film 824 positioned over the gate insulating film 802 to overlap with the conductive film 823, and the conductive film 818 and a conductive film 825 that are positioned over the semiconductor film 824 and function as a source terminal and a drain terminal. Note that the conductive film 823 also functions as the scan line GLc. The conductive film 825 is connected to a conductive film 830 functioning as the line VLb.

The transistor 37 includes, over the substrate 800 having an insulating surface, the conductive film 823 functioning as a gate electrode, the gate insulating film 802 over the conductive film 823, a semiconductor film 826 positioned over the gate insulating film 802 to overlap with the conductive film 823, and conductive films 827 and 828 that are positioned over the semiconductor film 826 and function as a source terminal and a drain terminal. The conductive film 828 is connected to a conductive film 829 functioning as the line VLc.

The transistor 15 includes, over the substrate 800 having an insulating surface, a conductive film 831 functioning as a gate electrode, the gate insulating film 802 over the conductive film 831, a semiconductor film 832 positioned over the gate insulating film 802 to overlap with the conductive film 831, and the conductive films 810 and 818 that are positioned over the semiconductor film 832 and function as a source terminal and a drain terminal. The transistor 15 further includes insulating films 820 and 821 that are sequentially stacked over the conductive films 810 and 818, and a conductive film 833 that functions as a back gate electrode and is positioned over the insulating films 820 and 821 to overlap with the semiconductor film 832. The conductive film 833 is connected to the conductive film 827. Further, the conductive film 831 is connected to the conductive film 814.

The capacitor 17 includes, over the substrate 800 having an insulating surface, a conductive film 834, the gate insulating film 802 over the conductive film 834, and the conductive film 818 positioned over the gate insulating film 802 to overlap with the conductive film 834. The conductive film 834 is connected to the conductive film 808.

The capacitor 38 includes, over the substrate 800 having an insulating surface, a conductive film 835, the gate insulating film 802 over the conductive film 835, and the conductive film 818 positioned over the gate insulating film 802 to overlap with the conductive film 835. The conductive film 835 is connected to the conductive film 827.

In addition, a conductive film 819 functioning as an anode is formed over the insulating film 821. The conductive film 819 is connected to the conductive film 817 through an opening 822 formed in the insulating films 820 and 821.

In addition, an insulating film 836 having an opening where part of the conductive film 819 is exposed is provided over the conductive film 819 and the insulating film 821. An EL layer 837 and a conductive film 838 functioning as a cathode are sequentially stacked over the part of the conductive film 819 and the insulating film 836. A region where the conductive film 819, the EL layer 837, and the conductive film 838 overlap with each other corresponds to the light-emitting element 14.

Note that in one embodiment of the present invention, the semiconductor film 803, 807, 809, 812, 813, 816, 824, 826, or 832 may contain an amorphous, microcrystalline, polycrystalline, or single crystal semiconductor (e.g., silicon or germanium) or a wide bandgap semiconductor (e.g., an oxide semiconductor).

For a light-emitting device including an amorphous silicon or oxide semiconductor transistor, a glass substrate of the fifth generation (1200 mm wide×1300 mm long) or later can be used. Thus, such a light-emitting device has advantages of high productivity and low cost. However, amorphous silicon or oxide semiconductor transistors generally have the same polarity and easily become normally on. In one embodiment of the present invention, even when the transistor 15 for controlling supply of current to the light-emitting element 14 is normally on, the transistor 15 is normally off by shifting the threshold voltage of the transistor 15, so that the threshold voltage can be acquired. Thus, even in a light-emitting device including an amorphous silicon or oxide semiconductor transistor, luminance unevenness can be reduced and high-quality images can be displayed.

Note that when the semiconductor film 803, 807, 809, 812, 813, 816, 824, 826, or 832 contains an amorphous, microcrystalline, polycrystalline, or single crystal semiconductor (e.g., silicon or germanium), an impurity region functioning as a source region or a drain region is formed by addition of an impurity element imparting conductivity to the semiconductor film. For example, an impurity region having n-type conductivity can be formed by addition of phosphorus or arsenic to the semiconductor film. Further, for example, an impurity region having p-type conductivity can be formed by addition of boron to the semiconductor film.

When the semiconductor film 803, 807, 809, 812, 813, 816, 824, 826, or 832 contains an oxide semiconductor, a dopant may be added to the semiconductor film to form an impurity region functioning as a source region or a drain region. The dopant can be added by ion implantation. A rare gas such as helium, argon, or xenon; a Group 15 atom such as nitrogen, phosphorus, arsenic, or antimony; or the like can be used as the dopant. For example, in the case where nitrogen is used as the dopant, the concentration of nitrogen atoms in the impurity region is preferably $5\times10^{19}/cm^3$ or higher and $1\times10^{22}/cm^3$ or lower.

Note that as a silicon semiconductor, any of the following can be used: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

Note that an oxide semiconductor preferably contains at least indium (In) or zinc (Zn). In particular, the oxide semiconductor preferably contains In and Zn. As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide; tin oxide; zinc oxide; a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a ternary metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a quaternary metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor. The oxide semiconductor may contain silicon.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when there is no electric field and off-state current can be sufficiently reduced. Further, with high mobility, the In—Ga—Zn-based oxide is suitable for a semiconductor material used in a semiconductor device.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above composition can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above composition is preferably used.

For example, with an In—Sn—Zn-based oxide, high mobility can be comparatively easily obtained. However, even with an In—Ga—Zn-based oxide, mobility can be increased by lowering defect density in a bulk.

Note that a highly-purified oxide semiconductor (a purified oxide semiconductor) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including the oxide semiconductor has extremely low off-state current. Further, the band gap of the oxide semiconductor is 2 eV or more, preferably 2.5 eV or more, more preferably 3 eV or more. With the use of an oxide semiconductor film that is highly purified by a sufficient decrease in concentration of impurities such as moisture or hydrogen and reduction of oxygen vacancies, the off-state current of the transistor can be decreased.

Specifically, various experiments can prove low off-state current of a transistor including a highly-purified oxide semiconductor for a semiconductor film. For example, even when an element has a channel width of $1 \times 10^6$ μm and a channel length of 10 μm, off-state current can be lower than or equal to the measurement limit of a semiconductor parameter analyzer, i.e., lower than or equal to $1 \times 10^{-13}$ A, at a voltage (drain voltage) between a source terminal and a drain terminal of 1 to 10 V. In that case, it can be seen that off-state current standardized on the channel width of the transistor is lower than or equal to 100 zA/μm. In addition, a capacitor and a transistor were connected to each other and off-state current was measured using a circuit in which electrical charge flowing to or from the capacitor is controlled by the transistor. In the measurement, a highly-purified oxide semiconductor film was used for a channel formation region of the transistor, and the off-state current of the transistor was measured from a change in the amount of electrical charge of the capacitor per unit hour. As a result, it can be seen that, in the case where the voltage between the source terminal and the drain terminal of the transistor is 3 V, a lower off-state current of several tens of yoctoamperes per micrometer (yA/μm) is obtained. Accordingly, the transistor including the highly-purified oxide semiconductor film for a channel formation region has much lower off-state current than a crystalline silicon transistor.

Note that unless otherwise specified, in this specification, off-state current of an n-channel transistor is current that flows between a source terminal and a drain terminal when the potential of the drain terminal is higher than that of the source terminal or that of a gate electrode while the potential of the gate electrode is 0 V or lower in the case of the potential of the source terminal used as a reference. Alternatively, in this specification, off-state current of a p-channel transistor is current that flows between a source terminal and a drain terminal when the potential of the drain terminal is lower than that of the source terminal or that of a gate electrode while the potential of the gate electrode is 0 V or higher in the case of the potential of the source terminal used as a reference.

For example, the oxide semiconductor film can be formed by sputtering using a target including indium (In), gallium (Ga), and zinc (Zn). In the case where an In—Ga—Zn-based oxide semiconductor film is formed by sputtering, it is preferable to use a target of an In—Ga—Zn-based oxide with an atomic ratio of In:Ga:Zn=1:1:1, 4:2:3, 3:1:2, 1:1:2, 2:1:3, or 3:1:4. When an oxide semiconductor film is formed using a target of an In—Ga—Zn-based oxide having the above atomic ratio, a polycrystal or a c-axis-aligned crystal (CAAC) OS to be described later is easily formed. The filling factor of the target including In, Ga, and Zn is higher than or equal to 90% and lower than or equal to 100%, preferably higher than or equal to 95% and lower than 100%. With the use of the target with a high filling factor, a dense oxide semiconductor film is formed.

In the case where an In—Zn-based material is used for the oxide semiconductor, a target used has an atomic ratio of In:Zn=50:1 to 1:2 (In$_2$O$_3$:ZnO=25:1 to 1:4 in a mole ratio), preferably In:Zn=20:1 to 1:1 (In$_2$O$_3$:ZnO=10:1 to 1:2 in a mole ratio), more preferably In:Zn=1.5:1 to 15:1 (In$_2$O$_3$:ZnO=3:4 to 15:2 in a mole ratio). For example, when a target used for deposition of an oxide semiconductor film formed using an In—Zn-based oxide has an atomic ratio of In:Zn:O=X:Y:Z, Z>1.5X+Y. The mobility can be increased by keeping the ratio of Zn within the above range.

Specifically, the oxide semiconductor film may be deposited in such a manner that the substrate is held in a treatment chamber kept in a reduced pressure state, moisture remaining in the treatment chamber is removed, a sputtering gas from which hydrogen and moisture are removed is introduced, and the target is used. The substrate temperature may be 100 to 600° C., preferably 200 to 400° C. during deposition. By deposition of the oxide semiconductor film while the substrate is heated, the concentration of impurities included in the deposited oxide semiconductor film can be lowered. In addition, damage by sputtering can be reduced. In order to remove moisture remaining in the treatment chamber, an adsorption vacuum pump is preferably used. For example, a cryopump, an ion pump, or a titanium sublimation pump is preferably used. A turbo pump to which a cold trap is added may be used as an exhaustion means. For example, a hydrogen atom, a compound containing a hydrogen atom, such as water (preferably a compound containing a carbon atom), and the like are exhausted from the treatment chamber with the use of a cryopump. Thus, the concentration of impurities contained in the oxide semiconductor film deposited in the treatment chamber can be lowered.

Note that the oxide semiconductor film formed by sputtering or the like contains a large amount of moisture or hydrogen (including a hydroxyl group) as an impurity in some cases. Moisture and hydrogen easily form donor levels and thus serve as impurities in the oxide semiconductor. Thus, in one embodiment of the present invention, in order to reduce impurities such as moisture or hydrogen in the oxide semiconductor film (in order to perform dehydration or dehydrogenation), the oxide semiconductor film is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring-down laser spectroscopy (CRDS) method).

By performing heat treatment on the oxide semiconductor film, moisture or hydrogen in the oxide semiconductor film can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, treatment can be performed even at a temperature higher than the strain point of a glass substrate.

Note that in some cases, the heat treatment makes oxygen released from the oxide semiconductor film and oxygen vacancies occur in the oxide semiconductor film. Thus, in one embodiment of the present invention, an insulating film containing oxygen is used as an insulating film that is in contact with the oxide semiconductor film, such as a gate insulating film. Then, heat treatment is performed after formation of the insulating film containing oxygen, so that oxygen is supplied from the insulating film to the oxide semiconductor film. With this structure, oxygen vacancies that serve as donors can be reduced and the stoichiometric proportion of the oxide semiconductor included in the oxide semiconductor film can be satisfied. It is preferable that the proportion of oxygen in the oxide semiconductor film be higher than the stoichiometric proportion. As a result, the oxide semiconductor film can be substantially intrinsic and variations in electrical characteristics of the transistor due to oxygen vacancies can be reduced, which results in an improvement of electrical characteristics.

Note that the heat treatment for supplying oxygen to the oxide semiconductor film is performed in an atmosphere of nitrogen, ultra dry air, or a rare gas (e.g., argon or helium) preferably at 200 to 400° C., for example, 250 to 350° C. It is preferable that the water content in the gas be 20 ppm or less, preferably 1 ppm or less, more preferably 10 ppb or less.

The oxide semiconductor may be either amorphous or crystalline. In the latter case, the oxide semiconductor may be either single crystalline or polycrystalline, may have a structure in which part of the oxide semiconductor is crystalline, may have an amorphous structure including a crystalline portion, or may be non-amorphous. As an example of the structure in which part of the oxide semiconductor is crystalline, an oxide semiconductor including a crystal with c-axis alignment (also referred to as a c-axis aligned crystalline oxide semiconductor (CAAC-OS)) that has a triangular or hexagonal atomic order when seen from the direction perpendicular to the a-b plane, a surface, or an interface may be used. In the crystal, metal atoms are arranged in a layered manner, or metal atoms and oxygen atoms are arranged in a layered manner when seen from the direction perpendicular to the c-axis, and the direction of the a-axis or the b-axis is varied in the a-b plane (the crystal rotates around the c-axis).

In a broad sense, CAAC-OS means a non-single-crystal oxide including a phase that has a triangular, hexagonal, regular triangular, or regular hexagonal atomic order when seen from the direction perpendicular to the a-b plane and in which metal atoms are arranged in a layered manner or metal atoms and oxygen atoms are arranged in a layered manner when seen from the direction perpendicular to the c-axis direction.

CAAC-OS is not single crystal but this does not mean that CAAC-OS is composed of only an amorphous component. Although CAAC-OS includes a crystal portion, a boundary between one crystal portion and another crystal portion is not clear in some cases.

Nitrogen may be substituted for part of oxygen included in CAAC-OS. The c-axes of crystal portions included in CAAC-OS may be aligned in a certain direction (e.g., a direction perpendicular to a surface of a substrate over which CAAC-OS is formed or a surface of CAAC-OS). Alternatively, the normals of the a-b planes of the crystal portions included in CAAC-OS may be aligned in a certain direction (e.g., a direction perpendicular to a surface of a substrate over which CAAC-OS is formed or a surface of CAAC-OS).

CAAC-OS transmits or does not transmit visible light depending on its composition or the like.

As an example of such CAAC-OS, there is a crystal that is formed into a film shape and has a triangular or hexagonal atomic order when seen from the direction perpendicular to a surface of the film or a surface of a substrate over which CAAC-OS is formed, and in which metal atoms are arranged in a layered manner or metal atoms and oxygen atoms (or nitrogen atoms) are arranged in a layered manner when a cross section of the film is observed.

For example, a CAAC-OS film is deposited by sputtering with a polycrystalline oxide semiconductor sputtering target.

When ions collide with the sputtering target, a crystal region included in the sputtering target may be separated from the target along the a-b plane, and a sputtered particle having a plane parallel to the a-b plane (a flat-plate-like sputtered particle or a pellet-like sputtered particle) might be separated from the sputtering target. In that case, the flat-plate-like sputtered particle reaches a substrate while maintaining its crystal state, so that the CAAC-OS film can be deposited.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the treatment chamber may be reduced. Further, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is 100° C. or higher and 740° C. or lower, preferably 200° C. or higher and 500° C. or lower. By increasing the substrate heating temperature during the deposition, when the flat-plate-like sputtered particle reaches the substrate, migration occurs on the substrate, so that a flat plane of the sputtered particle is attached to the substrate.

Further, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the sputtering target, an In—Ga—Zn—O compound target is described below.

A polycrystalline In—Ga—Zn—O compound target is made by mixing $InO_X$ powder, $GaO_Y$ powder, and $ZnO_Z$ powder in a predetermined mole ratio, applying pressure, and performing heat treatment at 1000° C. or higher and 1500° C. or lower. Note that X, Y, and Z are each a given positive number. Here, the predetermined mole ratio of the $InO_X$ powder, the $GaO_Y$ powder, and the $ZnO_Z$ powder is, for example, 2:2:1, 8:4:3, 3:1:1, 1:1:1, 4:2:3, or 3:1:2. The kinds of powder and the mole ratio for mixing powder may be changed as appropriate depending on a sputtering target to be formed.

This embodiment can be combined with any of the other embodiments as appropriate.

(Embodiment 5)

In a light-emitting device according to one embodiment of the present invention, it is possible to employ a color filter method in which full-color images are displayed using a combination of a color filter and a light-emitting element that emits light of a single color such as white. Alternatively, it is possible to employ a method in which full-color images are displayed using a plurality of light-emitting elements that emit light of different hues. This method is referred to as a separate coloring method because EL layers each provided between a pair of electrodes of a light-emitting element are separately colored with corresponding colors.

In the separate coloring method, in general, EL layers are separately applied by vapor deposition with the use of a mask such as a metal mask. Thus, the size of pixels depends on the accuracy of separate coloring of the EL layers by vapor deposition. On the other hand, unlike the separate coloring method, EL layers do not need to be separately applied in the color filter method. Accordingly, pixels can be downsized more easily as compared to the separate coloring method; thus, a high-definition pixel portion can be provided.

A light-emitting device includes, in its category, a bottom-emission light-emitting device in which light emitted from a light-emitting element is extracted from an element substrate over which a transistor is formed, and a top-emission light-emitting device in which light emitted from a light-emitting element is extracted from a side opposite to an element substrate. In the top-emission light-emitting device, light emitted from a light-emitting element is not blocked by an element such as a wiring, a transistor, or a capacitor, so that the efficiency of light extraction from a pixel can be made higher than that in the bottom-emission light-emitting device. Thus, the top-emission light-emitting device can achieve high luminance even when the value of current supplied to a light-emitting element is decreased, and thus is advantageous in improving the lifetime of the light-emitting element.

The light-emitting device according to one embodiment of the present invention may have a microcavity (micro optical resonator) structure in which light emitted from an EL layer resonates in a light-emitting element. With the microcavity structure, light having a specific wavelength can be extracted from the light-emitting element with high efficiency, so that the luminance and color purity of the pixel portion can be improved.

Figure 13:
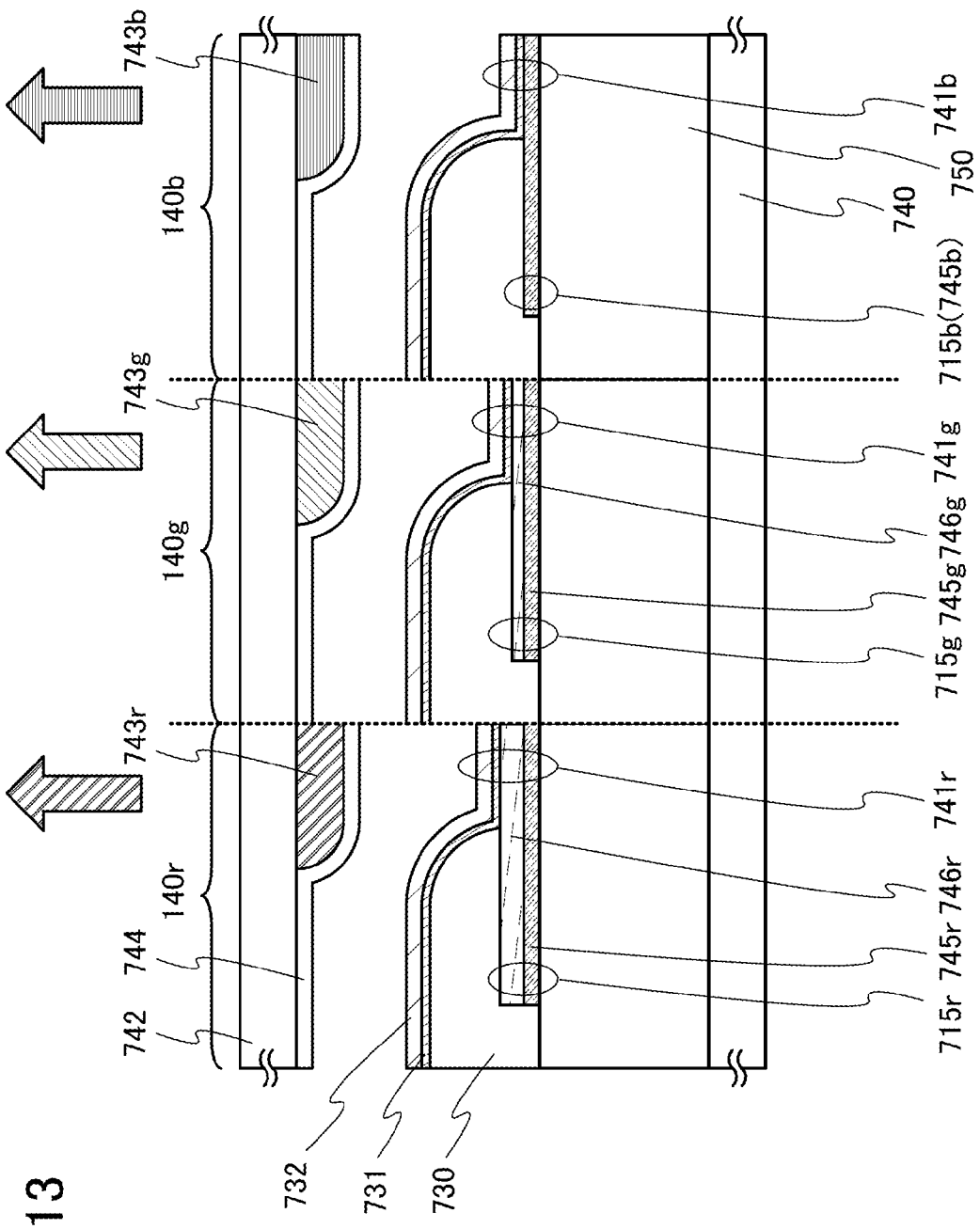
FIG. 13 is a cross-sectional view of a pixel.

FIG. 13 is an example of a cross-sectional view of pixels. Note that FIG. 13 illustrates part of a cross section of a pixel corresponding to red, part of a cross section of a pixel corresponding to green, and part of a cross section of a pixel corresponding to blue.

Specifically, FIG. 13 illustrates a pixel 140*r* corresponding to red, a pixel 140*g* corresponding to green, and a pixel 140*b* corresponding to blue. The pixel 140*r*, the pixel 140*g*, and the pixel 140*b* include an anode 715*r*, an anode 715*g*, and an anode 715*b*, respectively. The anodes 715*r*, 715*g*, and 715*b* included in the pixels 140*r*, 140*g*, and 140*b* are provided over an insulating film 750 formed over a substrate 740.

A bank 730 formed using an insulating film is provided over the anodes 715*r*, 715*g*, and 715*b*. The bank 730 has openings, where parts of the anodes 715*r*, 715*g*, and 715*b* are exposed. An EL layer 731 and a cathode 732 that transmits visible light are stacked in that order over the bank 730 to cover the exposed parts.

A portion where the anode 715*r*, the EL layer 731, and the cathode 732 overlap with each other corresponds to a light-emitting element 741*r* corresponding to red. A portion where the anode 715*g*, the EL layer 731, and the cathode 732 overlap with each other corresponds to a light-emitting element 741*g* corresponding to green. A portion where the anode 715*b*, the EL layer 731, and the cathode 732 overlap with each other corresponds to a light-emitting element 741*b* corresponding to blue.

A substrate 742 faces the substrate 740 with the light-emitting elements 741*r*, 741*g*, and 741*b* placed therebetween. A coloring layer 743*r* corresponding to the pixel 140*r*, a coloring layer 743*g* corresponding to the pixel 140*g*, and a coloring layer 743*b* corresponding to the pixel 140*b* are provided on the substrate 742. The coloring layer 743*r* is a layer whose transmittance of light in a wavelength range corresponding to red is higher than that of light in other wavelength ranges. The coloring layer 743*g* is a layer whose transmittance of light in a wavelength range corresponding to green is higher than that of light in other wavelength ranges. The coloring layer 743*b* is a layer whose transmittance of light in a wavelength range corresponding to blue is higher than that of light in other wavelength ranges.

An overcoat 744 is provided on the substrate 742 to cover the coloring layers 743r, 743g, and 743b. The overcoat 744 transmits visible light, is provided for protecting the coloring layers 743r, 743g, and 743b, and is preferably formed using a highly flattened resin material. The coloring layers 743r, 743g, and 743b and the overcoat 744 may be collectively regarded as a color filter, or each of the coloring layers 743r, 743g, and 743b may be regarded as a color filter.

In FIG. 13, a conductive film 745r with high visible-light reflectance and a conductive film 746r with higher visible-light transmittance than the conductive film 745r are stacked in that order as the anode 715r. A conductive film 745g with high visible-light reflectance and a conductive film 746g with higher visible-light transmittance than the conductive film 745g are stacked in that order as the anode 715g. The conductive film 746g is thinner than the conductive film 746r. A conductive film 745b with high visible-light reflectance is used as the anode 715b.

Thus, in the light-emitting device in FIG. 13, the optical path length of light emitted from the EL layer 731 in the light-emitting element 741r can be adjusted by the distance between the conductive film 745r and the cathode 732. The optical path length of light emitted from the EL layer 731 in the light-emitting element 741g can be adjusted by the distance between the conductive film 745g and the cathode 732. The optical path length of light emitted from the EL layer 731 in the light-emitting element 741b can be adjusted by the distance between the conductive film 745b and the cathode 732.

In one embodiment of the present invention, a microcavity structure may be employed in which the optical path lengths are adjusted in accordance with the wavelengths of light emitted from the light-emitting elements 741r, 741g, and 741b so that light emitted from the EL layer 731 resonates in each light-emitting element.

When the microcavity structure is applied to the light-emitting device according to one embodiment of the present invention, light with a wavelength corresponding to red among the light emitted from the light-emitting element 741r resonates in the microcavity structure to increase its intensity. Consequently, the color purity and luminance of red light obtained through the coloring layer 743r are improved. Light with a wavelength corresponding to green among the light emitted from the light-emitting element 741g resonates in the microcavity structure to increase its intensity. Consequently, the color purity and luminance of green light obtained through the coloring layer 743g are improved. Light with a wavelength corresponding to blue among the light emitted from the light-emitting element 741b resonates in the microcavity structure to increase its intensity. Consequently, the color purity and luminance of blue light obtained through the coloring layer 743b are improved.

Note that although the pixels corresponding to three colors of red, green, and blue are shown in FIG. 13, one embodiment of the present invention is not limited to this structure. In one embodiment of the present invention, a combination of four colors of red, green, blue, and yellow or a combination of three colors of cyan, magenta, and yellow may be used. Alternatively, a combination of six colors of pale red, pale green, pale blue, deep red, deep green, and deep blue, or a combination of six colors of red, green, blue, cyan, magenta, and yellow may be used.

Note that colors that can be expressed using pixels of red, green, and blue, for example, are limited to colors existing in a triangle made by three points on a chromaticity diagram that correspond to the emission colors of the pixels. Thus, by additionally providing a light-emitting element of a color existing outside the triangle on the chromaticity diagram as in the case where pixels of red, green, blue, and yellow are used, the range of the colors that can be expressed in the light-emitting device can be expanded and the color reproducibility can be improved.

In FIG. 13, the conductive film 745b with high visible-light reflectance is used as the anode in the light-emitting element 741b which emits light with the shortest wavelength λ, among the light-emitting elements 741r, 741g, and 741b, and the conductive films 746r and 746g having different thicknesses are used in the other light-emitting elements 741r and 741g; thus, the optical path lengths are adjusted. In one embodiment of the present invention, a conductive film with high visible-light transmittance, such as the conductive films 746r and 746g, may be provided over the conductive film 745b with high visible-light reflectance also in the light-emitting element 741b which emits light with the shortest wavelength λ. However, it is preferable to use the conductive film 745b with high visible-light reflectance as the anode of the light-emitting element 741b which emits light with the shortest wavelength 2, as shown in FIG. 13, because the fabrication process of the anode can be simplified as compared to the case where a conductive film with high visible-light transmittance is used as the anodes of all the light-emitting elements.

Note that the work function of the conductive film 745b with high visible-light reflectance is often lower than those of the conductive films 746r and 746g with high visible-light transmittance. Accordingly, in the light-emitting element 741b which emits light with the shortest wavelength λ, holes are less likely to be injected from the anode 715b into the EL layer 731 than in the light-emitting elements 741r and 741g, resulting in low emission efficiency. In view of this, in one embodiment of the present invention, a composite material that contains a substance having a high hole-transport property and a substance having an acceptor property (electron-accepting property) with respect to the substance having a high hole-transport property is preferably used for part of the EL layer 731 that is in contact with the conductive film 745b with high visible-light reflectance in the light-emitting element 741b which emits light with the shortest wavelength λ. When the composite material is formed in contact with the anode 715b, holes can be easily injected from the anode 715b into the EL layer 731, so that the emission efficiency of the light-emitting element 741b can be increased.

Examples of the substance having an acceptor property are 7,7,8,8-tetracyano-2,3,5,6-tetrafluoroquinodimethane ($F_4$-TCNQ), chloranil, a transition metal oxide, and oxides of metals that belong to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high acceptor properties. Among these, molybdenum oxide is particularly preferable because it is stable in the air, has a low hygroscopic property, and is easily treated.

As the substance having a high hole-transport property used for the composite material, any of a variety of compounds such as an aromatic amine compound, a carbazole derivative, aromatic hydrocarbon, and a high molecular compound (e.g., an oligomer, a dendrimer, or a polymer) can be used. An organic compound used for the composite material is preferably an organic compound having a high hole-transport property. Specifically, a substance having a hole mobility of $10^{-6}$ cm$^2$/V·s or higher is preferably used. Note that any other substance may be used as long as its hole-transport property is higher than its electron-transport property.

The conductive films 745r, 745g, and 745b having high visible-light reflectance can be formed with a single layer or a stack of aluminum, silver, or an alloy containing such a metal material, for example. Alternatively, the conductive films 745*r*, 745*g*, and 745*b* may be formed by stacking a conductive film with high visible-light reflectance and a thin conductive film (preferably with a thickness of 20 nm or less, more preferably 10 nm or less). For example, a thin titanium film or a thin molybdenum film is stacked over a conductive film with high visible-light reflectance to form the conductive film 745*b*, so that an oxide film can be prevented from being formed on a surface of the conductive film with high visible-light reflectance (e.g., aluminum, an alloy containing aluminum, or silver).

The conductive films 746*r* and 746*g* with high visible-light transmittance can be formed using, for example, indium oxide, tin oxide, zinc oxide, indium tin oxide, or indium zinc oxide.

The cathode 732 can be formed, for example, by stacking a conductive film thin enough to transmit light (preferably with a thickness of 20 nm or less, more preferably 10 nm or less) and a conductive film including a conductive metal oxide. The conductive film thin enough to transmit light can be formed with a single layer or a stack of silver, magnesium, an alloy containing such a metal material, or the like. Examples of the conductive metal oxide are indium oxide, tin oxide, zinc oxide, indium tin oxide, indium zinc oxide, and any of these metal oxide materials containing silicon oxide.

This embodiment can be combined with any of the other embodiments as appropriate.

(Embodiment 6)

In this embodiment, a bottom-emission structure, a top-emission structure, and a dual-emission structure are described. In the dual-emission structure, light from a light-emitting element is extracted from an element substrate side and a side opposite to the element substrate.

Figure 14A:
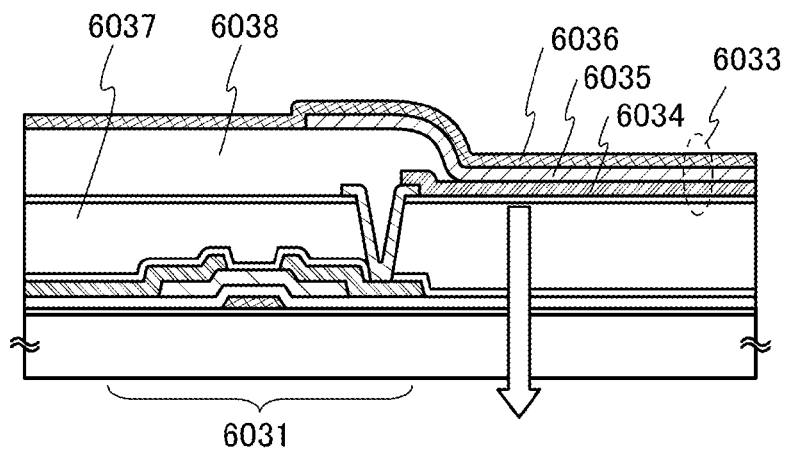
FIGS. 14A to 14C are cross-sectional views of pixels.

FIG. 14A is a cross-sectional view of a pixel in which light emitted from a light-emitting element 6033 is extracted from an anode 6034 side. A transistor 6031 is covered with an insulating film 6037, and a bank 6038 having an opening is formed over the insulating film 6037. In the opening of the bank 6038, the anode 6034 is partly exposed, and the anode 6034, an EL layer 6035, and a cathode 6036 are stacked in that order in the opening.

The anode 6034 is formed using a material through which light passes easily or formed to a thickness such that light passes through the anode 6034 easily. The cathode 6036 is formed using a material through which light does not easily pass or formed to a thickness such that light does not easily pass through the cathode 6036. Accordingly, it is possible to obtain a bottom-emission structure in which light is extracted from the anode 6034 side as indicated by an outline arrow.

Figure 14B:
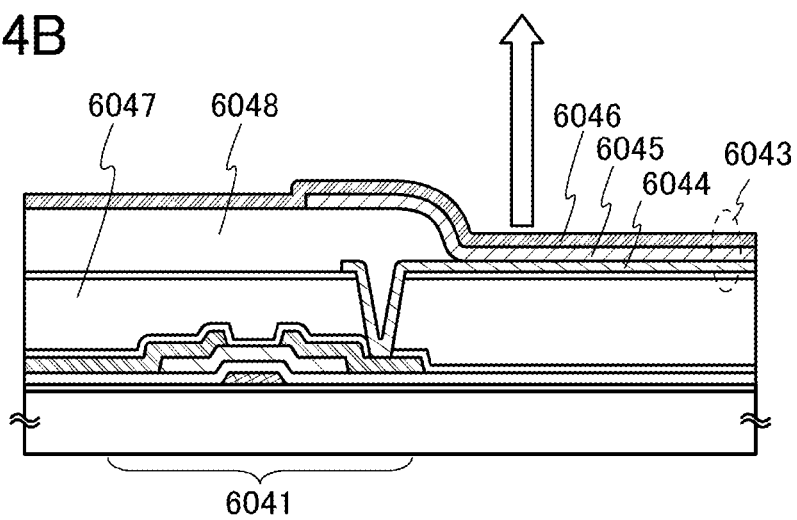

FIG. 14B is a cross-sectional view of a pixel in which light emitted from a light-emitting element 6043 is extracted from a cathode 6046 side. A transistor 6041 is covered with an insulating film 6047, and a bank 6048 having an opening is formed over the insulating film 6047. In the opening of the bank 6048, an anode 6044 is partly exposed, and the anode 6044, an EL layer 6045, and the cathode 6046 are stacked in that order in the opening.

The anode 6044 is formed using a material through which light does not easily pass or formed to a thickness such that light does not easily pass through the anode 6044. The cathode 6046 is formed using a material through which light passes easily or formed to a thickness such that light passes through the cathode 6046 easily. Accordingly, it is possible to obtain a top-emission structure in which light is extracted from the cathode 6046 side as indicated by an outline arrow.

Figure 14C:
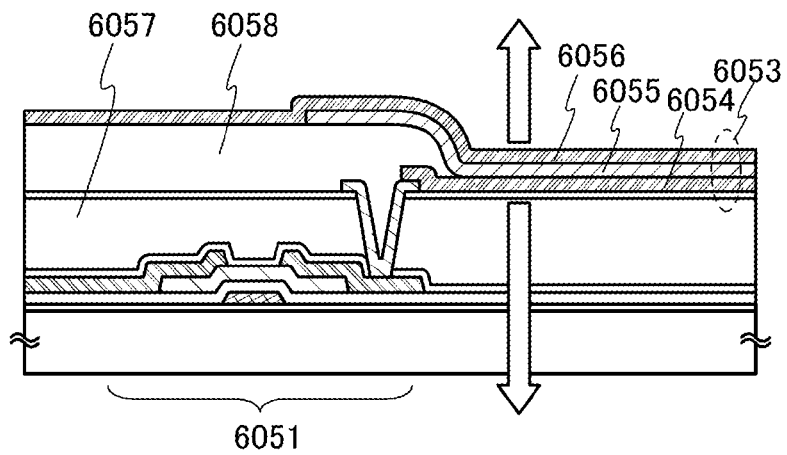

FIG. 14C is a cross-sectional view of a pixel in which light emitted from a light-emitting element 6053 is extracted from an anode 6054 side and a cathode 6056 side. A transistor 6051 is covered with an insulating film 6057, and a bank 6058 having an opening is formed over the insulating film 6057. In the opening of the bank 6058, the anode 6054 is partly exposed, and the anode 6054, an EL layer 6055, and the cathode 6056 are stacked in that order in the opening.

The anode 6054 and the cathode 6056 are formed using a material through which light passes easily or formed to a thickness such that light passes through the anode 6054 and the cathode 6056 easily. Accordingly, it is possible to obtain a dual-emission structure in which light is extracted from the anode 6054 side and the cathode 6056 side as indicated by outline arrows.

For the electrode serving as the anode or the cathode, any of metals, alloys, electrically conductive compounds, and mixtures thereof can be used, for example. Specific examples are indium oxide-tin oxide (indium tin oxide (ITO)), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti). Other examples are elements that belong to Group 1 or 2 in the periodic table, for example, an alkali metal such as lithium (Li) or cesium (Cs), an alkaline earth metal such as calcium (Ca) or strontium (Sr), magnesium (Mg), an alloy containing such an element (e.g., MgAg or AlLi), a rare earth metal such as europium (Eu) or ytterbium (Yb), an alloy containing such an element, and graphene. The electrode is formed using a material selected from the above as appropriate and formed to an optimum thickness, so that a top-emission structure, a bottom-emission structure, or a dual-emission structure can be selectively formed.

This embodiment can be combined with any of the other embodiments as appropriate.

(Embodiment 7)

Figure 15:
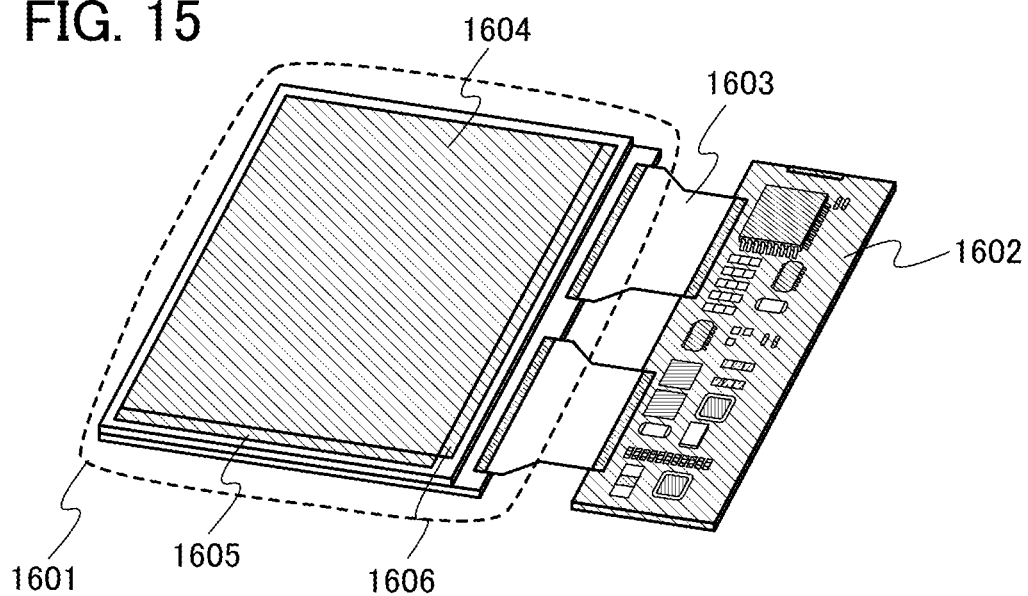
FIG. 15 is a perspective view of a panel.

FIG. 15 is an example of a perspective view of a light-emitting device according to one embodiment of the present invention.

The light-emitting device in FIG. 15 includes a panel 1601, a circuit board 1602, and joints 1603. The panel 1601 includes a pixel portion 1604 including a plurality of pixels, a scan line driver circuit 1605 that selects a plurality of pixels row by row, and a signal line driver circuit 1606 that controls input of image signals to the pixels in a selected row. Specifically, signals to be input to a variety of scan lines are generated in the scan line driver circuit 1605.

A variety of signals and power supply potentials are input from the circuit board 1602 to the panel 1601 through the joints 1603. A flexible printed circuit (FPC) or the like can be used as the joint 1603. In the case where a COF tape is used as the joint 1603, part of circuits in the circuit board 1602 or part of the scan line driver circuit 1605 or the signal line driver circuit 1606 included in the panel 1601 may be formed on a chip separately prepared, and the chip may be connected to the COF tape by chip on film (COF).

This embodiment can be combined with any of the other embodiments.

(Embodiment 8)

A light-emitting device according to one embodiment of the present invention can be used for display devices, personal computers, or image reproducing devices provided with recording media (typically, devices that reproduce the content of recording media such as digital versatile discs (DVDs) and have displays for displaying the reproduced images). Further, as electronic devices that can include the light-emitting device according to one embodiment of the present invention, cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 16A to 16E illustrate specific examples of these electronic devices.

Figure 16A:
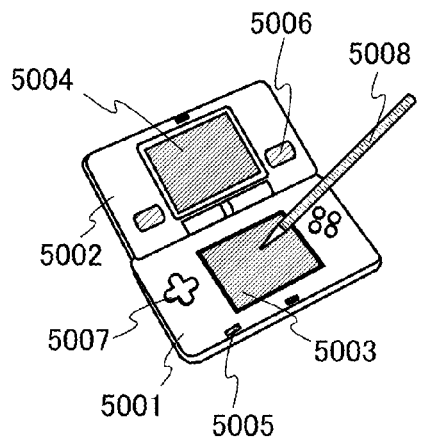
FIGS. 16A to 16E illustrate electronic devices.

FIG. 16A illustrates a portable game machine, which includes a housing 5001, a housing 5002, a display portion 5003, a display portion 5004, a microphone 5005, speakers 5006, an operation key 5007, a stylus 5008, and the like. It is possible to provide a high-definition portable game machine having less luminance unevenness with the use of the light-emitting device according to one embodiment of the present invention as the display portion 5003 or 5004. Note that although the portable game machine in FIG. 16A has the two display portions 5003 and 5004, the number of display portions included in the portable game machine is not limited thereto.

Figure 16B:
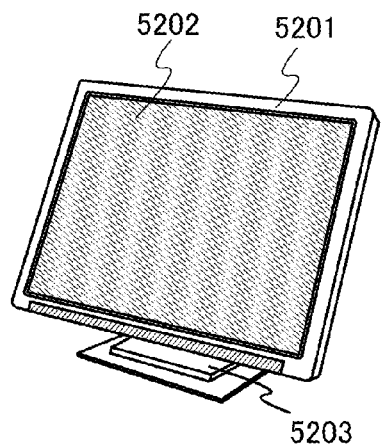

FIG. 16B illustrates a display device, which includes a housing 5201, a display portion 5202, a support 5203, and the like. It is possible to provide a high-definition display device having less luminance unevenness with the use of the light-emitting device according to one embodiment of the present invention as the display portion 5202. Note that the display device means all display devices for displaying information, such as display devices for personal computers, for receiving TV broadcast, and for displaying advertisements.

Figure 16C:
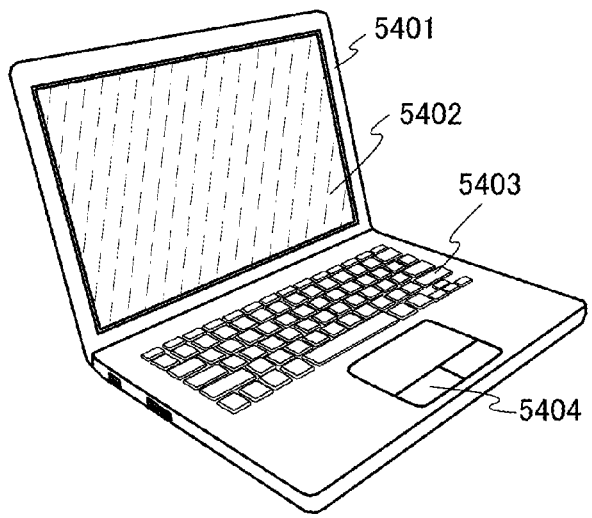

FIG. 16C illustrates a laptop, which includes a housing 5401, a display portion 5402, a keyboard 5403, a pointing device 5404, and the like. It is possible to provide a high-definition laptop having less luminance unevenness with the use of the light-emitting device according to one embodiment of the present invention as the display portion 5402.

Figure 16D:
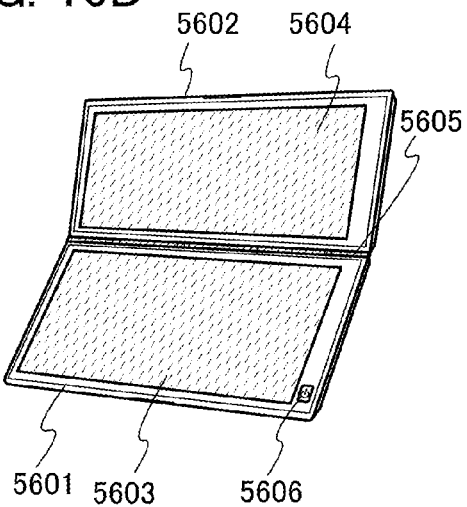

FIG. 16D illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. It is possible to provide a high-definition personal digital assistant having less luminance unevenness with the use of the light-emitting device according to one embodiment of the present invention as the first display portion 5603 or the second display portion 5604. A light-emitting device with a position input function may be used as at least one of the first display portion 5603 and the second display portion 5604. Note that the position input function can be added by provision of a touch panel in a light-emitting device. Alternatively, the position input function can be added by provision of a photoelectric conversion element called a photosensor in a pixel portion of a light-emitting device.

Figure 16E:
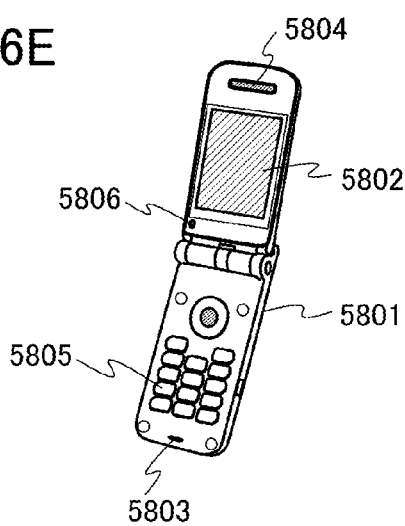

FIG. 16E illustrates a cellular phone, which includes a housing 5801, a display portion 5802, an audio input portion 5803, an audio output portion 5804, operation keys 5805, a light receiving portion 5806, and the like. Light received in the light receiving portion 5806 is converted into electrical signals, so that external images can be loaded. It is possible to provide a high-definition cellular phone having less luminance unevenness with the use of the light-emitting device according to one embodiment of the present invention as the display portion 5802.

This embodiment can be combined with any of the other embodiments as appropriate.

This application is based on Japanese Patent Application serial No. 2011-200067 filed with Japan Patent Office on Sep. 14, 2011, the entire contents of which are hereby incorporated by reference.

What is claimed is:

1. A light-emitting device comprising:
a light-emitting element;
a transistor;
a first switch;
a second switch; and
a third switch,
wherein the transistor controls supply of current to the light-emitting element and comprises a semiconductor film and a first gate electrode and a second gate electrode facing each other with the semiconductor film provided therebetween,
wherein the first switch controls supply of a potential of an image signal to the first gate electrode of the transistor,
wherein the second switch controls supply of a potential to the second gate electrode of the transistor, and
wherein the third switch controls connection between the first gate electrode and a drain terminal of the transistor.

2. The light-emitting device according to claim 1, wherein the transistor is an n-channel transistor.

3. The light-emitting device according to claim 1, wherein the semiconductor film included in the transistor contains amorphous silicon or an oxide semiconductor.

4. The light-emitting device according to claim 1, wherein at least one of the first to third switches is composed of one or more transistors.

5. The light-emitting device according to claim 1, wherein at least one of the first to third switches is composed of one or more n-channel transistors.

6. A light-emitting device comprising:
a light-emitting element;
a transistor;
a first switch;
a second switch; and
a third switch,
wherein the transistor controls supply of current to the light-emitting element in response to an image signal and comprises a semiconductor film and a first gate electrode and a second gate electrode facing each other with the semiconductor film provided therebetween,
wherein the first switch controls supply of a potential of the image signal to the first gate electrode of the transistor,
wherein the second switch controls supply of a potential to the second gate electrode of the transistor, and
wherein the third switch brings the first gate electrode and a drain terminal of the transistor into conduction while the transistor is normally off by supply of the potential to the second gate electrode and brings the first gate electrode and the drain terminal of the transistor out of conduction while the current is supplied to the light-emitting element in response to the potential of the image signal.

7. The light-emitting device according to claim 6, wherein the transistor is an n-channel transistor.

8. The light-emitting device according to claim 6, wherein the semiconductor film included in the transistor contains amorphous silicon or an oxide semiconductor.

9. The light-emitting device according to claim 6, wherein at least one of the first to third switches is composed of one or more transistors.

10. The light-emitting device according to claim 6, wherein at least one of the first to third switches is composed of one or more n-channel transistors.

11. A light-emitting device comprising:
a light-emitting element;
a transistor;
a first switch;
a second switch;
a third switch; and
a capacitor,
wherein the transistor controls supply of current to the light-emitting element and comprises a semiconductor film and a first gate electrode and a second gate electrode facing each other with the semiconductor film provided therebetween,
wherein the first switch controls supply of a potential of an image signal to the first gate electrode of the transistor,
wherein the second switch controls supply of a potential to the second gate electrode of the transistor,
wherein the third switch controls connection between the first gate electrode and a drain terminal of the transistor, and
wherein the capacitor holds a potential difference between the first gate electrode and a source terminal of the transistor.

12. The light-emitting device according to claim 11, wherein the capacitor and the light-emitting element are connected in series to each other.

13. The light-emitting device according to claim 11, wherein the transistor is an n-channel transistor.

14. The light-emitting device according to claim 11, wherein the semiconductor film included in the transistor contains amorphous silicon or an oxide semiconductor.

15. The light-emitting device according to claim 11, wherein at least one of the first to third switches is composed of one or more transistors.

16. The light-emitting device according to claim 11, wherein at least one of the first to third switches is composed of one or more n-channel transistors.

17. A light-emitting device comprising:
a light-emitting element;
a transistor;
a first switch;
a second switch;
a third switch; and
a capacitor,
wherein the transistor controls supply of current to the light-emitting element in response to an image signal and comprises a semiconductor film and a first gate electrode and a second gate electrode facing each other with the semiconductor film provided therebetween,
wherein the first switch controls supply of a potential of the image signal to the first gate electrode of the transistor,
wherein the second switch controls supply of a potential to the second gate electrode of the transistor,
wherein the third switch brings the first gate electrode and a drain terminal of the transistor into conduction while the transistor is normally off by supply of the potential to the second gate electrode and brings the first gate electrode and the drain terminal of the transistor out of conduction while the current is supplied to the light-emitting element in response to the potential of the image signal, and
wherein the capacitor holds a potential difference between the first gate electrode and a source terminal of the transistor.

18. The light-emitting device according to claim 17, wherein the capacitor and the light-emitting element are connected in series to each other.

19. The light-emitting device according to claim 17, wherein the transistor is an n-channel transistor.

20. The light-emitting device according to claim 17, wherein the semiconductor film included in the transistor contains amorphous silicon or an oxide semiconductor.

21. The light-emitting device according to claim 17, wherein at least one of the first to third switches is composed of one or more transistors.

22. The light-emitting device according to claim 17, wherein at least one of the first to third switches is composed of one or more n-channel transistors.

* * * * *